(12) United States Patent
Coffey et al.

(10) Patent No.: US 9,401,552 B2
(45) Date of Patent: Jul. 26, 2016

(54) MANAGED CONNECTIVITY IN ELECTRICAL SYSTEMS AND METHODS THEREOF

(71) Applicant: ADS Telecommunications, Inc., Berwyn, PA (US)

(72) Inventors: Joseph C. Coffey, Burnsville, MN (US); Loren J. Mattson, Richfield, MN (US)

(73) Assignee: COMMSCOPE TECHNOLOGIES LLC, Hickory, NC (US)

( * ) Notice: Subject to any disclaimer, the term of this patent is extended or adjusted under 35 U.S.C. 154(b) by 0 days.

(21) Appl. No.: 14/656,801

(22) Filed: Mar. 13, 2015

(65) Prior Publication Data

US 2015/0188245 A1 Jul. 2, 2015

Related U.S. Application Data

(63) Continuation of application No. 12/905,689, filed on Oct. 15, 2010, now Pat. No. 8,992,260.

(60) Provisional application No. 61/252,395, filed on Oct. 16, 2009.

(51) Int. Cl.
*H01R 12/00* (2006.01)
*H01R 12/70* (2011.01)
(Continued)

(52) U.S. Cl.
CPC ............ *H01R 12/70* (2013.01); *H01R 13/518* (2013.01); *H01R 13/641* (2013.01); *H01R 13/6658* (2013.01); *H01R 24/64* (2013.01); *Y10S 439/955* (2013.01); *Y10T 29/49147* (2015.01)

(58) Field of Classification Search
CPC ............ H01R 13/518; H01R 13/641; H01R 13/6658; H01R 24/64; H01R 12/70; H01R 9/24; H01R 12/716; H01R 13/465; H01R 13/717; H01R 13/7175; Y10S 439/955; Y10T 29/49147
USPC ......... 439/76.1, 676, 709, 922, 955, 488–490
See application file for complete search history.

(56) References Cited

U.S. PATENT DOCUMENTS

| 3,243,761 | A | 3/1966 | Piorunneck |
| 4,127,317 | A | 11/1978 | Tyree |

(Continued)

FOREIGN PATENT DOCUMENTS

| CA | 2 499 803 | 4/2004 |
| DE | 102 44 304 B3 | 3/2004 |

(Continued)

OTHER PUBLICATIONS

*Avaya's Enhanced SYSTIMAX® iPatch System Enables IT Managers to Optimise Network Efficiency and Cut Downtime*, Press Release, May 9, 2003, obtained from http://www.avaya.com/usa/about-avaya/newsroom/news-releases/2003/pr-030509 on Jan. 7, 2009.

(Continued)

*Primary Examiner* — Neil Abrams
*Assistant Examiner* — Travis Chambers
(74) *Attorney, Agent, or Firm* — Merchant & Gould P.C.

(57) ABSTRACT

An electrical connector arrangement includes a storage device coupled to a connector housing. The storage device is configured to store physical layer information pertaining to the electrical connector arrangement. The storage device also has contacts that enable the physical layer information to be read from the storage device by a media reading interface. A connector assembly includes at least one receptacle assembly; a printed circuit board; and a media reading interface.

20 Claims, 36 Drawing Sheets

(51) Int. Cl.
*H01R 13/641* (2006.01)
*H01R 13/66* (2006.01)
*H01R 24/64* (2011.01)
*H01R 13/518* (2006.01)

(56) References Cited

U.S. PATENT DOCUMENTS

| | | | |
|---|---|---|---|
| 4,679,879 A | 7/1987 | Triner et al. | |
| 4,684,245 A | 8/1987 | Goldring | |
| 4,953,194 A | 8/1990 | Hansen et al. | |
| 4,968,929 A | 11/1990 | Hauck et al. | |
| 4,978,310 A | 12/1990 | Shichida | |
| 5,052,940 A | 10/1991 | Bengal | |
| 5,107,532 A | 4/1992 | Hansen et al. | |
| 5,161,988 A | 11/1992 | Krupka | |
| 5,166,970 A | 11/1992 | Ward | |
| 5,222,164 A | 6/1993 | Bass, Sr. et al. | |
| 5,265,187 A | 11/1993 | Morin et al. | |
| 5,305,405 A | 4/1994 | Emmons et al. | |
| 5,353,367 A | 10/1994 | Czosnowski et al. | |
| 5,393,249 A | 2/1995 | Morgenstern et al. | |
| 5,394,503 A | 2/1995 | Dietz, Jr. et al. | |
| 5,413,494 A | 5/1995 | Dewey et al. | |
| 5,415,570 A | 5/1995 | Sarkissian | |
| 5,418,334 A | 5/1995 | Williams | |
| 5,419,717 A * | 5/1995 | Abendschein | G02B 6/3897 385/139 |
| 5,448,675 A | 9/1995 | Leone et al. | |
| 5,467,062 A | 11/1995 | Burroughs | |
| 5,470,251 A | 11/1995 | Sano | |
| 5,473,715 A | 12/1995 | Schofield et al. | |
| 5,483,467 A | 1/1996 | Krupka et al. | |
| 5,492,478 A * | 2/1996 | White | H01R 4/2429 439/151 |
| 5,660,567 A | 8/1997 | Nierlich et al. | |
| 5,674,085 A | 10/1997 | Davis et al. | |
| 5,685,741 A | 11/1997 | Dewey et al. | |
| 5,712,942 A | 1/1998 | Jennings et al. | |
| 5,764,043 A | 6/1998 | Czosnowski et al. | |
| 5,800,192 A | 9/1998 | David et al. | |
| 5,821,510 A | 10/1998 | Cohen et al. | |
| 5,854,824 A | 12/1998 | Bengal et al. | |
| 5,871,368 A | 2/1999 | Erdner et al. | |
| 5,910,776 A | 6/1999 | Black | |
| 6,002,331 A | 12/1999 | Laor | |
| 6,079,996 A | 6/2000 | Arnett | |
| 6,095,837 A | 8/2000 | David et al. | |
| 6,095,851 A | 8/2000 | Laity et al. | |
| 6,116,961 A | 9/2000 | Henneberger et al. | |
| 6,222,908 B1 | 4/2001 | Bartolutti et al. | |
| 6,222,975 B1 | 4/2001 | Gilbert et al. | |
| 6,227,911 B1 | 5/2001 | Boutros et al. | |
| 6,234,830 B1 | 5/2001 | Ensz et al. | |
| 6,238,235 B1 | 5/2001 | Shavit et al. | |
| 6,280,231 B1 | 8/2001 | Nicholls | |
| 6,285,293 B1 | 9/2001 | German et al. | |
| 6,300,877 B1 | 10/2001 | Schannach et al. | |
| 6,330,148 B1 | 12/2001 | Won et al. | |
| 6,330,307 B1 | 12/2001 | Bloch et al. | |
| 6,350,148 B1 | 2/2002 | Bartolutti et al. | |
| 6,358,093 B1 * | 3/2002 | Phommachanh | H01R 24/64 439/188 |
| 6,364,694 B1 | 4/2002 | Lien | |
| 6,421,322 B1 | 7/2002 | Koziy et al. | |
| 6,422,895 B1 | 7/2002 | Lien | |
| 6,424,710 B1 | 7/2002 | Bartolutti et al. | |
| 6,456,768 B1 * | 9/2002 | Boncek | G02B 6/3817 385/100 |
| D466,479 S | 12/2002 | Pein et al. | |
| 6,499,861 B1 | 12/2002 | German et al. | |
| 6,511,231 B2 | 1/2003 | Lampert et al. | |
| 6,522,737 B1 | 2/2003 | Bartolutti et al. | |
| 6,554,484 B2 | 4/2003 | Lampert | |
| 6,574,586 B1 | 6/2003 | David et al. | |
| 6,612,856 B1 | 9/2003 | McCormack | |
| 6,626,697 B1 | 9/2003 | Martin et al. | |
| 6,636,152 B2 | 10/2003 | Schannach et al. | |
| 6,684,179 B1 | 1/2004 | David | |
| 6,725,177 B2 | 4/2004 | David et al. | |
| 6,743,044 B2 | 6/2004 | Musolf et al. | |
| 6,793,408 B2 | 9/2004 | Levy et al. | |
| 6,802,735 B2 | 10/2004 | Pepe et al. | |
| 6,808,116 B1 | 10/2004 | Eslambolchi et al. | |
| 6,811,446 B1 | 11/2004 | Chang | |
| 6,814,624 B2 | 11/2004 | Clark et al. | |
| 6,847,856 B1 | 1/2005 | Bohannon | |
| 6,850,685 B2 | 2/2005 | Tinucci et al. | |
| 6,890,197 B2 | 5/2005 | Liebenow | |
| 6,898,368 B2 | 5/2005 | Colombo et al. | |
| 6,905,363 B2 | 6/2005 | Musolf et al. | |
| 6,932,517 B2 | 8/2005 | Swayze et al. | |
| D510,068 S | 9/2005 | Haggay et al. | |
| 6,939,168 B2 | 9/2005 | Oleynick et al. | |
| 6,961,675 B2 | 11/2005 | David | |
| 6,968,994 B1 | 11/2005 | Ashwood Smith | |
| 6,971,895 B2 * | 12/2005 | Sago | G02B 6/3895 439/188 |
| 6,976,867 B2 | 12/2005 | Navarro et al. | |
| 7,077,710 B2 | 7/2006 | Haggay et al. | |
| 7,081,808 B2 | 7/2006 | Colombo et al. | |
| 7,112,090 B2 | 9/2006 | Caveney et al. | |
| 7,123,810 B2 | 10/2006 | Parrish | |
| 7,153,142 B2 | 12/2006 | Shifris et al. | |
| 7,165,728 B2 | 1/2007 | Durrant et al. | |
| 7,193,422 B2 | 3/2007 | Velleca et al. | |
| 7,207,819 B2 | 4/2007 | Chen | |
| 7,210,858 B2 | 5/2007 | Sago et al | |
| 7,226,217 B1 | 6/2007 | Benton et al. | |
| 7,234,944 B2 | 6/2007 | Nordin et al. | |
| 7,241,157 B2 | 7/2007 | Zhuang et al. | |
| 7,297,018 B2 | 11/2007 | Caveney et al. | |
| 7,312,715 B2 | 12/2007 | Shalts et al. | |
| D559,186 S | 1/2008 | Kelmer | |
| 7,315,224 B2 | 1/2008 | Gurovich et al. | |
| 7,352,285 B2 | 4/2008 | Sakama et al. | |
| 7,352,289 B1 | 4/2008 | Harris | |
| 7,370,106 B2 | 5/2008 | Caveney | |
| 7,374,101 B2 * | 5/2008 | Kaneko | G06K 7/10178 235/492 |
| 7,384,300 B1 | 6/2008 | Salgado et al. | |
| 7,396,245 B2 | 7/2008 | Huang et al. | |
| 7,479,032 B2 | 1/2009 | Hoath et al. | |
| 7,481,681 B2 | 1/2009 | Caveney et al. | |
| 7,497,709 B1 | 3/2009 | Zhang | |
| 7,519,000 B2 | 4/2009 | Caveney et al. | |
| 7,534,137 B2 | 5/2009 | Caveney et al. | |
| 7,552,872 B2 | 6/2009 | Tokita et al. | |
| 7,559,805 B1 | 7/2009 | Yi et al. | |
| 7,563,116 B2 | 7/2009 | Wang | |
| 7,570,861 B2 | 8/2009 | Smrha et al. | |
| 7,575,454 B1 | 8/2009 | Aoki et al. | |
| 7,588,470 B2 | 9/2009 | Li et al. | |
| 7,591,667 B2 | 9/2009 | Gatnau Navarro et al. | |
| 7,605,707 B2 | 10/2009 | German et al. | |
| 7,607,926 B2 | 10/2009 | Wang | |
| 7,635,280 B1 | 12/2009 | Crumlin et al. | |
| 7,648,377 B2 | 1/2010 | Naito et al. | |
| 7,682,174 B2 | 3/2010 | Chen | |
| 7,722,370 B2 | 5/2010 | Chin | |
| 7,727,026 B2 | 6/2010 | Qin et al. | |
| 7,753,717 B2 | 7/2010 | Belopolsky et al. | |
| 7,785,154 B2 | 8/2010 | Peng | |
| 7,798,832 B2 | 9/2010 | Qin et al. | |
| 7,811,119 B2 | 10/2010 | Caveney et al. | |
| 7,814,240 B2 | 10/2010 | Salgado et al. | |
| 7,867,017 B1 | 1/2011 | Chen | |
| 7,869,426 B2 | 1/2011 | Hough et al. | |
| 7,872,738 B2 | 1/2011 | Abbott | |
| 7,880,475 B2 | 2/2011 | Crumlin et al. | |
| 7,934,022 B2 | 4/2011 | Velleca et al. | |
| 8,157,582 B2 | 4/2012 | Frey et al. | |
| 8,272,892 B2 | 9/2012 | McNeely et al. | |
| 8,282,425 B2 | 10/2012 | Bopp et al. | |
| 8,287,316 B2 | 10/2012 | Pepe et al. | |

(56) References Cited

U.S. PATENT DOCUMENTS

| | | | |
|---|---|---|---|
| 8,449,318 B2 | 5/2013 | Beller et al. | |
| 8,992,260 B2 | 3/2015 | Coffey et al. | |
| 2002/0008613 A1 | 1/2002 | Nathan et al. | |
| 2004/0052498 A1 | 3/2004 | Colombo et al. | |
| 2004/0240807 A1 | 12/2004 | Frohlich et al. | |
| 2006/0148279 A1 | 7/2006 | German et al. | |
| 2006/0160395 A1 | 7/2006 | Macauley et al. | |
| 2007/0237470 A1 | 10/2007 | Aronson et al. | |
| 2007/0254529 A1 | 11/2007 | Pepe et al. | |
| 2008/0090454 A1 | 4/2008 | Hoath et al. | |
| 2008/0096438 A1* | 4/2008 | Clark | H01R 13/518 439/713 |
| 2008/0100467 A1 | 5/2008 | Downie et al. | |
| 2008/0286987 A1* | 11/2008 | Timmins | H04Q 1/13 439/49 |
| 2009/0097846 A1 | 4/2009 | Kozischek et al. | |
| 2009/0098763 A1 | 4/2009 | Below et al. | |
| 2009/0148106 A1 | 6/2009 | Moore et al. | |
| 2009/0166404 A1 | 7/2009 | German et al. | |
| 2009/0215310 A1 | 8/2009 | Hoath et al. | |
| 2009/0232455 A1 | 9/2009 | Nhep | |
| 2010/0048064 A1 | 2/2010 | Peng | |
| 2010/0055971 A1* | 3/2010 | Craig | H05K 7/186 439/488 |
| 2010/0211664 A1 | 8/2010 | Raza et al. | |
| 2010/0211665 A1 | 8/2010 | Raza et al. | |
| 2010/0211697 A1 | 8/2010 | Raza et al. | |
| 2010/0215049 A1 | 8/2010 | Raza et al. | |
| 2010/0267274 A1* | 10/2010 | McNally | H04Q 1/136 439/488 |
| 2011/0256767 A1* | 10/2011 | Malstrom | H01R 13/6683 439/620.01 |
| 2012/0003877 A1* | 1/2012 | Bareel | H01R 13/6658 439/676 |
| 2012/0021636 A1 | 1/2012 | Debenedictis et al. | |

FOREIGN PATENT DOCUMENTS

| | | |
|---|---|---|
| DE | 10 2004 033 940 A1 | 2/2006 |
| GB | 2 236 398 A | 4/1991 |
| WO | WO 00/65696 | 11/2000 |
| WO | WO 02/47215 | 6/2002 |
| WO | WO 2010/001400 A1 | 1/2010 |
| WO | WO 2010/081186 A1 | 7/2010 |
| WO | WO 2010/121639 A1 | 10/2010 |

OTHER PUBLICATIONS

*Avaya's Enhanced SYSTIMAX® iPatch System Enables IT Managers to Optimise Network Efficiency and Cut Downtime*, Press Release, May 20, 2003, obtained from http://www.avaya.com/usa/about-avaya/newsroom/news-releases/2003/pr-030520 on Jan. 7, 2009.

*Intelligent patching systems carving out a 'large' niche*, Cabling Installation & Maintenance, vol. 12, Issue 7, Jul. 2004 (5 pages).

*intelliMAC: The intelligent way to make Moves, Adds or Changes!*NORDX/CDT © 2003 (6 pages).

International Search Report and Written Opinion mailed Jan. 12, 2011.

iTRACS Physical Layer Manager FAQ, obtained on Jun. 11, 2008 from http://www.itracs.com/products/physical-layer-manager-faqs.mtml (6pages).

Meredith, L., "Managers missing point of intelligent patching," *Daa Center News*, Jun. 21, 2005, obtained Dec. 2, 2008 from http://searchdatacenter.techtarget.com/news/article/0,289142,sid80_gcil099991,00.html.

Ohtsuki, F. et al., "Design of Optical Connectors with ID Modules," *Electronics and Communications in* Japan, Part 1, vol. 77, No. 2, pp. 94-105 (Feb. 1994).

*SYSTIMAX® iPatch System Wins Platinum Network of the Year Award*, Press Release, Jan. 30, 2003, obtained from http://www.avaya.com/usa/about-avaya/newsroom/news-releases/2003/pr-030130a on Jan. 7, 2009.

TrueNet; TFP Series Rack Mount Fiber Panels, Spec Sheet; May 2008; 8 pages.

* cited by examiner

MANAGED CONNECTIVITY IN ELECTRICAL SYSTEMS AND METHODS THEREOF

CROSS-REFERENCE TO RELATED APPLICATIONS

This application is a continuation of application Ser. No. 12/905,689, filed Oct. 15, 2010, now U.S. Pat. No. 8,992,260, issued Mar. 31, 2015, which application claims the benefit of provisional application Ser. No. 61/252,395, filed Oct. 16, 2009, and titled Managed Connectivity in Electrical Systems and Methods Thereof, which applications are incorporated herein by reference in their entirety.

BACKGROUND

In communications infrastructure installations, a variety of communications devices can be used for switching, cross-connecting, and interconnecting communications signal transmission paths in a communications network. Some such communications devices are installed in one or more equipment racks to permit organized, high-density installations to be achieved in limited space available for equipment.

Communications devices can be organized into communications networks, which typically include numerous logical communication links between various items of equipment. Often a single logical communication link is implemented using several pieces of physical communication media. For example, a logical communication link between a computer and an inter-networking device such as a hub or router can be implemented as follows. A first cable connects the computer to a jack mounted in a wall. A second cable connects the wall-mounted jack to a port of a patch panel, and a third cable connects the inter-networking device to another port of a patch panel. A "patch cord" cross connects the two together. In other words, a single logical communication link is often implemented using several segments of physical communication media.

Network management systems (NMS) are typically aware of logical communication links that exist in a communications network, but typically do not have information about the specific physical layer media (e.g., the communications devices, cables, couplers, etc.) that are used to implement the logical communication links. Indeed, NMS systems typically do not have the ability to display or otherwise provide information about how logical communication links are implemented at the physical layer level.

SUMMARY

The present disclosure relates to communications connector assemblies and arrangements that provide physical layer management (PLM) capabilities.

BRIEF DESCRIPTION OF THE FIGURES

The accompanying drawings, which are incorporated in and constitute a part of the description, illustrate several aspects of the present disclosure. A brief description of the drawings is as follows.

DETAILED DESCRIPTION

Figure 1:
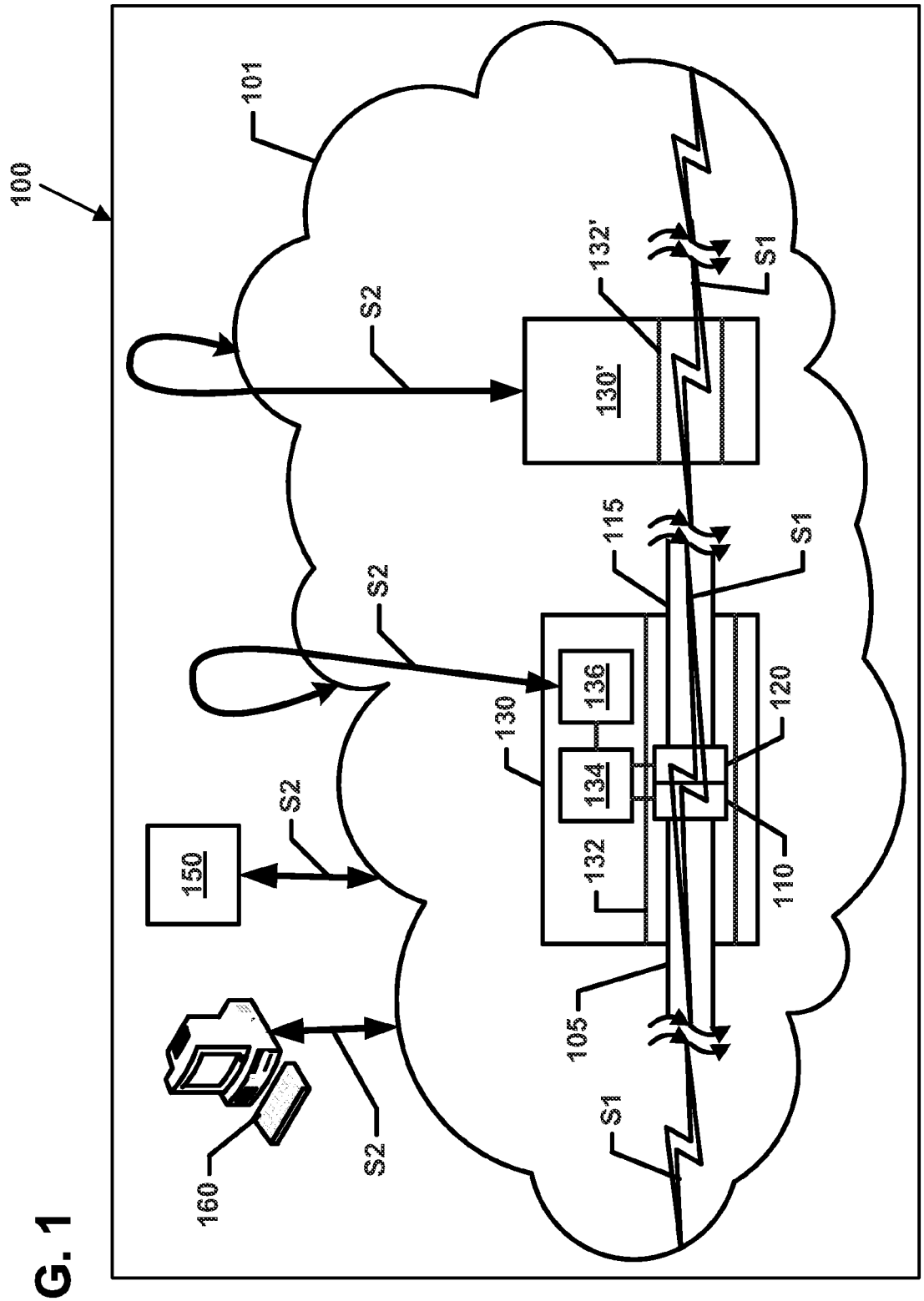
FIG. 1 is a diagram of a portion of an example communications and data management system in accordance with aspects of the present disclosure.

FIG. 1 is a diagram of a portion of an example communications and data management system 100. The example system 100 shown in FIG. 1 includes a part of a communications network 101 along which communications signals S1 pass. In one example implementation, the network 101 can include an Internet Protocol network. In other implementations, however, the communications network 101 may include other types of networks.

The communications network 101 includes interconnected network components (e.g., connector assemblies, inter-networking devices, internet working devices, servers, outlets, and end user equipment (e.g., computers)). In one example implementation, communications signals S1 pass from a computer to a wall outlet to a port of communication panel, to a first port of an inter-networking device, out another port of the inter-networking device, to a port of the same or another communications panel, to a rack mounted server.

The portion of the communications network 101 shown in FIG. 1 includes first and second connector assemblies 130, 130' at which communications signals S1 pass from one portion of the communications network 101 to another portion of the communications network 101. Non-limiting examples of connector assemblies 130, 130' include, for example, rack-mounted connector assemblies (e.g., patch panels, distribution units, and media converters for fiber and copper physical communication media), wall-mounted connector assemblies (e.g., boxes, jacks, outlets, and media converters for fiber and copper physical communication media), and inter-networking devices (e.g., switches, routers, hubs, repeaters, gateways, and access points). In the example shown, the first connector assembly 130 defines at least one port 132 configured to communicatively couple at least a first media segment 105 to at least a second media segment 115 to enable the communication signals S1 to pass between the media segments 105, 115.

The at least one port 132 of the first connector assembly 130 may be directly connected to a port 132' of the second connector assembly 130'. As the term is used herein, the port 132 is directly connected to the port 132' when the communications signals S1 pass between the two ports 132, 132' without passing through an intermediate port. For example, routing a patchcord between port 132 and port 132' directly connects the ports 132, 132'.

The port 132 of the first connector assembly 130 also may be indirectly connected to the port 132' of the second connector assembly 130'. As the term is used herein, the port 132 is indirectly connected to the port 132' when the communications signals S1 pass through an intermediate port when traveling between the ports 132, 132'. For example, in one implementation, the communications signals S1 may be routed over one media segment from the port 132 at the first connector assembly 130 to a port of a third connector assembly at which the media segment is coupled to another media segment that is routed from the port of the third connector assembly to the port 132' of the second connector assembly 130'.

Non-limiting examples of media segments include optical fibers, which carry optical data signals, and electrical conductors (e.g., CAT-5, 6, and 7 twisted-pair cables), which carry electrical data signals. Media segments also can include electrical plugs, fiber optic connectors (e.g., SC, LC, FC, LX.5, or MPO connectors), adapters, media converters, and other physical components terminating to the fibers, conductors, or other such media segments. The techniques described here also can be used with other types of connectors including, for example, BNC connectors, F connectors, DSX jacks and plugs, bantam jacks and plugs.

In the example shown, each media segment 105, 115 is terminated at a plug or connector 110, 120, respectively, which is configured to communicatively connect the media segments 105, 115. For example, in one implementation, the port 132 of the connector assembly 130 can be configured to align ferrules of two fiber optic connectors 110, 120. In another implementation, the port 132 of the connector assembly 130 can be configured to electrically connect an electrical plug with an electrical socket (e.g., a jack). In yet another implementation, the port 132 can include a media converter configured to connect an optical fiber to an electrical conductor.

In accordance with some aspects, the connector assembly 130 does not actively manage (e.g., is passive with respect to) the communications signals S1 passing through port 132. For example, in some implementations, the connector assembly 130 does not modify the communications signal S1 carried over the media segments 105, 115. Further, in some implementations, the connector assembly 130 does not read, store, or analyze the communications signal S1 carried over the media segments 105, 115.

In accordance with aspects of the disclosure, the communications and data management system 100 also provides physical layer information (PLI) functionality as well as physical layer management (PLM) functionality. As the term is used herein, "PLI functionality" refers to the ability of a physical component or system to identify or otherwise associate physical layer information with some or all of the physical components used to implement the physical layer of the system. As the term is used herein, "PLM functionality" refers to the ability of a component or system to manipulate or to enable others to manipulate the physical components used to implement the physical layer of the system (e.g., to track what is connected to each component, to trace connections that are made using the components, or to provide visual indications to a user at a selected component).

As the term is used herein, "physical layer information" refers to information about the identity, attributes, and/or status of the physical components used to implement the physical layer of the communications system 101. In accordance with some aspects, physical layer information of the communications system 101 can include media information, device information, and location information.

As the term is used herein, "media information" refers to physical layer information pertaining to cables, plugs, connectors, and other such media segments. In accordance with some aspects, the media information is stored on or in the media segments, themselves. In accordance with other aspects, the media information can be stored at one or more data repositories for the communications system, either alternatively or in addition to the media, themselves. Non-limiting examples of media information include a part number, a serial number, a plug or other connector type, a conductor or fiber type, a cable or fiber length, cable polarity, a cable or fiber pass-through capacity, a date of manufacture, a manufacturing lot number, information about one or more visual attributes of physical communication media (e.g., information about the color or shape of the physical communication media or an image of the physical communication media), and an insertion count (i.e., a record of the number of times the media segment has been connected to another media segment or network component). Media information also can include testing or media quality or performance information. The testing or media quality or performance information, for example, can be the results of testing that is performed when a particular segment of media is manufactured.

As the term is used herein, "device information" refers to physical layer information pertaining to the communications panels, inter-networking devices, media converters, computers, servers, wall outlets, and other physical communications devices to which the media segments attach. In accordance with some aspects, the device information is stored on or in the devices, themselves. In accordance with other aspects, the device information can be stored at one or more data repositories for the communications system, either alternatively or in addition to the devices, themselves. Non-limiting examples of device information include a device identifier, a device type, port priority data (that associates a priority level with each port), and port updates (described in more detail herein).

As the term is used herein, "location information" refers to physical layer information pertaining to a physical layout of a building or buildings in which the network 101 is deployed. Location information also can include information indicating where each communications device, media segment, network component, or other component that is physically located within the building. In accordance with some aspects, the location information of each system component is stored on or in the respective component. In accordance with other aspects, the location information can be stored at one or more data repositories for the communications system, either alternatively or in addition to the system components, themselves.

In accordance with some aspects, one or more of the components of the communications network 101 is configured to store physical layer information pertaining to the component as will be disclosed in more detail herein. In FIG. 1, the connectors 110, 120, the media segments 105, 115, and/or the connector assemblies 130, 130' may store physical layer information. For example, in FIG. 1, each connector 110, 120 may store information pertaining to itself (e.g., type of connector, data of manufacture, etc.) and/or to the respective media segment 105, 115 (e.g., type of media, test results, etc.).

In another example implementation, the media segments 105, 115 or connectors 110, 120 may store media information that includes a count of the number of times that the media segment (or connector) has been inserted into port 132. In such an example, the count stored in or on the media segment is updated each time the segment (or plug or connector) is inserted into port 132. This insertion count value can be used, for example, for warranty purposes (e.g., to determine if the connector has been inserted more than the number of times specified in the warranty) or for security purposes (e.g., to detect unauthorized insertions of the physical communication media).

In accordance with certain aspects, one or more of the components of the communications network 101 also can read the physical layer information from one or more media segments retained thereat. In certain implementations, one or more network components includes a media reading interface that is configured to read physical layer information stored on or in the media segments or connectors attached thereto. For example, in one implementation, the connector assembly 130 includes a media reading interface 134 that can read media information stored on the media cables 105, 115 retained within the port 132. In another implementation, the media reading interface 134 can read media information stored on the connectors or plugs 110, 120 terminating the cables 105, 115, respectively.

In some implementations, some types of physical layer information can be obtained by the connector assembly 130 from a user at the connector assembly 130 via a user interface (e.g., a keypad, a scanner, a touch screen, buttons, etc.). The connector assembly 130 can provide the physical layer information obtained from the user to other devices or systems that are coupled to the network 101 (as described in more detail herein). In other implementations, some or all physical layer information can be obtained by the connector assembly 130 from other devices or systems that are coupled to the network 101. For example, physical layer information pertaining to media that is not configured to store such information can be entered manually into another device or system that is coupled to the network 101 (e.g., at the connector assembly 130, at the computer 160, or at the aggregation point 150).

In some implementations, some types of non-physical layer information (e.g., network information) can be obtained by one network component from other devices or systems that are coupled to the network 101. For example, the connector assembly 130 may pull non-physical layer information from one or more components of the network 101. In other implementations, the non-physical layer information can be obtained by the connector assembly 130 from a user at the connector assembly 130.

In accordance with some aspects of the disclosure, the physical layer information read by a network component may be processed or stored at the component. For example, in certain implementations, the first connector assembly 130 shown in FIG. 1 is configured to read physical layer information stored on the connectors 110, 120 and/or on the media segments 105, 115 using media reading interface 134. Accordingly, in FIG. 1, the first connector assembly 130 may store not only physical layer information about itself (e.g., the total number of available ports at that assembly 130, the number of ports currently in use, etc.), but also physical layer information about the connectors 110, 120 inserted at the ports and/or about the media segments 105, 115 attached to the connectors 110, 120.

In some implementations, the connector assembly 130 is configured to add, delete, and/or change the physical layer information stored in or on the segment of physical communication media 105, 115 (i.e., or the associated connectors 110, 120). For example, in some implementations, the media information stored in or on the segment of physical communication media 105, 115 can be updated to include the results of testing that is performed when a segment of physical media is installed or otherwise checked. In other implementations, such testing information is supplied to the aggregation point 150 for storage and/or processing. In some implementations, modification of the physical layer information does not affect the communications signals S1 passing through the connector assembly 130.

In other implementations, the physical layer information obtained by the media reading interface (e.g., interface 134 of FIG. 1) may be communicated (see PLI signals S2) over the network 101 for processing and/or storage. The components of the communications network 101 are connected to one or more aggregation devices 150 (described in greater detail herein) and/or to one or more computing systems 160. For example, in the implementation shown in FIG. 1, each connector assembly 130 includes a PLI port 136 that is separate from the "normal" ports 132 of the connector assembly 130. Physical layer information is communicated between the connector assembly 130 and the network 101 through the PLI port 136. In the example shown in FIG. 1, the connector assembly 130 is connected to a representative aggregation device 150, a representative computing system 160, and to other components of the network 101 (see looped arrow) via the PLI port 136.

The physical layer information is communicated over the network 101 just like any other data that is communicated over the network 101, while at the same time not affecting the communication signals S1 that pass through the connector assembly 130 on the normal ports 132. Indeed, in some implementations, the physical layer information may be communicated as one or more of the communication signals S1 that pass through the normal ports 132 of the connector assemblies 130, 130'. For example, in one implementation, a media segment may be routed between the PLI port 136 and one of the "normal" ports 132. In such an implementation, the physical layer information may be passed along the communications network 101 to other components of the communications network 101 (e.g., to the one or more aggregation points 150 and/or to the one or more computer systems 160). By using the network 101 to communicate physical layer information pertaining to it, an entirely separate network need not be provided and maintained in order to communicate such physical layer information.

In other implementations, however, the communications network 101 includes a data network along which the physical layer information described above is communicated. At least some of the media segments and other components of the data network may be separate from those of the communications network 101 to which such physical layer information pertains. For example, in some implementations, the first connector assembly 130 may include a plurality of fiber optic adapters defining ports at which connectorized optical fibers are optically coupled together to create an optical path for communications signals S1. The first connector assembly 130 also may include one or more electrical cable ports at which the physical layer information (see PLI signals S2) are passed to other parts of the data network. (e.g., to the one or more aggregation points 150 and/or to the one or more computer systems 160).

Figure 2:
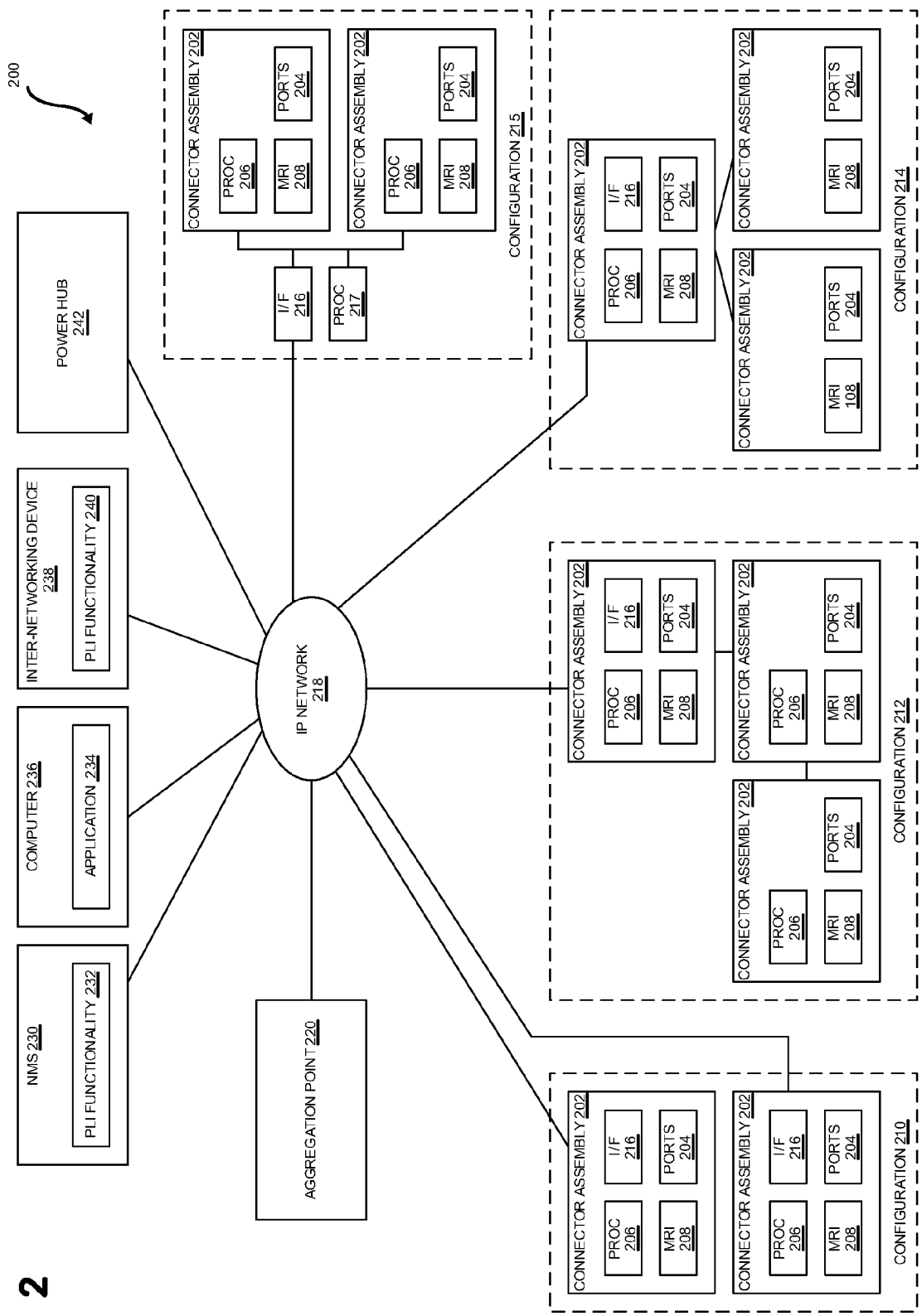
FIG. 2 is a block diagram of one implementation of a communications management system that includes PLI functionality as well as PLM functionality in accordance with aspects of the present disclosure.

FIG. 2 is a block diagram of one example implementation of a communications management system 200 that includes PLI functionality as well as PLM functionality. The management system 200 comprises a plurality of connector assemblies 202. The system 200 includes one or more connector assemblies 202 connected to an IP network 218. The connector assemblies 202 shown in FIG. 2 illustrate various implementations of the connector assembly 130 of FIG. 1.

Each connector assembly 202 includes one or more ports 204, each of which is used to connect two or more segments of physical communication media to one another (e.g., to implement a portion of a logical communication link for communication signals S1 of FIG. 1). At least some of the connector assemblies 202 are designed for use with segments of physical communication media that have physical layer information stored in or on them. The physical layer information is stored in or on the segment of physical communication media in a manner that enables the stored information, when the segment is attached to a port 204, to be read by a programmable processor 206 associated with the connector assembly 202.

In the particular implementation shown in FIG. 2, each of the ports 204 of the connector assemblies 202 comprises a respective media reading interface 208 via which the respective programmable processor 206 is able to determine if a physical communication media segment is attached to that port 204 and, if one is, to read the physical layer information stored in or on the attached segment (if such media information is stored therein or thereon). The programmable processor 206 associated with each connector assembly 202 is communicatively coupled to each of the media reading interfaces 208 using a suitable bus or other interconnect (not shown).

In the particular implementation shown in FIG. 2, four example types of connector assembly configurations are shown. In the first connector assembly configuration 210 shown in FIG. 2, each connector assembly 202 includes its own respective programmable processor 206 and its own respective network interface 216 that is used to communicatively couple that connector assembly 202 to an Internet Protocol (IP) network 218.

In the second type of connector assembly configuration 212, a group of connector assemblies 202 are physically located near each other (e.g., in a bay or equipment closet). Each of the connector assemblies 202 in the group includes its own respective programmable processor 206. However, in the second connector assembly configuration 212, some of the connector assemblies 202 (referred to here as "interfaced connector assemblies") include their own respective network interfaces 216 while some of the connector assemblies 202 (referred to here as "non-interfaced connector assemblies") do not. The non-interfaced connector assemblies 202 are communicatively coupled to one or more of the interfaced connector assemblies 202 in the group via local connections. In this way, the non-interfaced connector assemblies 202 are communicatively coupled to the IP network 218 via the network interface 216 included in one or more of the interfaced connector assemblies 202 in the group. In the second type of connector assembly configuration 212, the total number of network interfaces 216 used to couple the connector assemblies 202 to the IP network 218 can be reduced. Moreover, in the particular implementation shown in FIG. 2, the non-interfaced connector assemblies 202 are connected to the interfaced connector assembly 202 using a daisy chain topology (though other topologies can be used in other implementations and embodiments).

In the third type of connector assembly configuration 214, a group of connector assemblies 202 are physically located near each other (e.g., within a bay or equipment closet). Some of the connector assemblies 202 in the group (also referred to here as "master" connector assemblies 202) include both their own programmable processors 206 and network interfaces 216, while some of the connector assemblies 202 (also referred to here as "slave" connector assemblies 202) do not include their own programmable processors 206 or network interfaces 216. Each of the slave connector assemblies 202 is communicatively coupled to one or more of the master connector assemblies 202 in the group via one or more local connections. The programmable processor 206 in each of the master connector assemblies 202 is able to carry out the PLM functions for both the master connector assembly 202 of which it is a part and any slave connector assemblies 202 to which the master connector assembly 202 is connected via the local connections. As a result, the cost associated with the slave connector assemblies 202 can be reduced. In the particular implementation shown in FIG. 2, the slave connector assemblies 202 are connected to a master connector assembly 202 in a star topology (though other topologies can be used in other implementations and embodiments).

Each programmable processor 206 is configured to execute software or firmware that causes the programmable processor 206 to carry out various functions described below. Each programmable processor 206 also includes suitable memory (not shown) that is coupled to the programmable processor 206 for storing program instructions and data. In general, the programmable processor 206 determines if a physical communication media segment is attached to a port 204 with which that processor 206 is associated and, if one is, to read the identifier and attribute information stored in or on the attached physical communication media segment (if the segment includes such information stored therein or thereon) using the associated media reading interface 208.

In the fourth type of connector assembly configuration 215, a group of connector assemblies 202 are housed within a common chassis or other enclosure. Each of the connector assemblies 202 in the configuration 215 includes their own programmable processors 206. In the context of this configuration 215, the programmable processors 206 in each of the connector assemblies are "slave" processors 206. Each of the slave programmable processor 206 is also communicatively coupled to a common "master" programmable processor 217 (e.g., over a backplane included in the chassis or enclosure). The master programmable processor 217 is coupled to a network interface 216 that is used to communicatively couple the master programmable processor 217 to the IP network 218.

In this configuration 215, each slave programmable processor 206 is configured to determine if physical communication media segments are attached to its port 204 and to read the physical layer information stored in or on the attached physical communication media segments (if the attached segments have such information stored therein or thereon) using the associated media reading interfaces 208. The physical layer information is communicated from the slave programmable processor 206 in each of the connector assemblies 202 in the chassis to the master processor 217. The master processor 217 is configured to handle the processing associated with communicating the physical layer information read from by the slave processors 206 to devices that are coupled to the IP network 218.

The system 200 includes functionality that enables the physical layer information that the connector assemblies 202 capture to be used by application-layer functionality outside of the traditional physical-layer management application domain. That is, the physical layer information is not retained in a PLM "island" used only for PLM purposes but is instead made available to other applications. In the particular implementation shown in FIG. 2, the management system 200 includes an aggregation point 220 that is communicatively coupled to the connector assemblies 202 via the IP network 218.

The aggregation point 220 includes functionality that obtains physical layer information from the connector assemblies 202 (and other devices) and stores the physical layer information in a data store. The aggregation point 220 can be used to receive physical layer information from various types of connector assemblies 202 that have functionality for automatically reading information stored in or on the segment of physical communication media. Also, the aggregation point 220 and aggregation functionality 224 can be used to receive physical layer information from other types of devices that have functionality for automatically reading information stored in or on the segment of physical communication media. Examples of such devices include end-user devices—such as computers, peripherals (e.g., printers, copiers, storage devices, and scanners), and IP telephones—that include functionality for automatically reading information stored in or on the segment of physical communication media.

The aggregation point 220 also can be used to obtain other types of physical layer information. For example, in this implementation, the aggregation point 220 also obtains information about physical communication media segments that is not otherwise automatically communicated to an aggregation point 220. This information can be provided to the aggregation point 220, for example, by manually entering such information into a file (e.g., a spreadsheet) and then uploading the file to the aggregation point 220 (e.g., using a web browser) in connection with the initial installation of each of the various items. Such information can also, for example, be directly entered using a user interface provided by the aggregation point 220 (e.g., using a web browser).

The aggregation point 220 also includes functionality that provides an interface for external devices or entities to access the physical layer information maintained by the aggregation point 220. This access can include retrieving information from the aggregation point 220 as well as supplying information to the aggregation point 220. In this implementation, the aggregation point 220 is implemented as "middleware" that is able to provide such external devices and entities with transparent and convenient access to the PLI maintained by the access point 220. Because the aggregation point 220 aggregates PLI from the relevant devices on the IP network 218 and provides external devices and entities with access to such PLI, the external devices and entities do not need to individually interact with all of the devices in the IP network 218 that provide PLI, nor do such devices need to have the capacity to respond to requests from such external devices and entities.

For example, as shown in FIG. 2, a network management system (NMS) 230 includes PLI functionality 232 that is configured to retrieve physical layer information from the aggregation point 220 and provide it to the other parts of the NMS 230 for use thereby. The NMS 230 uses the retrieved physical layer information to perform one or more network management functions. The NMS 230 communicates with the aggregation point 220 over the IP network 218.

As shown in FIG. 2, an application 234 executing on a computer 236 can also use the API implemented by the aggregation point 220 to access the PLI information maintained by the aggregation point 220 (e.g., to retrieve such information from the aggregation point 220 and/or to supply such information to the aggregation point 220). The computer 236 is coupled to the IP network 218 and accesses the aggregation point 220 over the IP network 218.

In the example shown in FIG. 2, one or more inter-networking devices 238 used to implement the IP network 218 include physical layer information (PLI) functionality 240. The PLI functionality 240 of the inter-networking device 238 is configured to retrieve physical layer information from the aggregation point 220 and use the retrieved physical layer information to perform one or more inter-networking functions. Examples of inter-networking functions include Layer 1, Layer 2, and Layer 3 (of the OSI model) inter-networking functions such as the routing, switching, repeating, bridging, and grooming of communication traffic that is received at the inter-networking device.

The aggregation point 220 can be implemented on a standalone network node (e.g., a standalone computer running appropriate software) or can be integrated along with other network functionality (e.g., integrated with an element management system or network management system or other network server or network element). Moreover, the functionality of the aggregation point 220 can be distribute across many nodes and devices in the network and/or implemented, for example, in a hierarchical manner (e.g., with many levels of aggregation points). The IP network 218 can include one or more local area networks and/or wide area networks (e.g., the Internet). As a result, the aggregation point 220, NMS 230, and computer 236 need not be located at the same site as each other or at the same site as the connector assemblies 202 or the inter-networking devices 238.

Also, power can be supplied to the connector assemblies 202 using conventional "Power over Ethernet" techniques specified in the IEEE 802.3af standard, which is hereby incorporated herein by reference. In such an implementation, a power hub 242 or other power supplying device (located near or incorporated into an inter-networking device that is coupled to each connector assembly 202) injects DC power onto one or more of the wires (also referred to here as the "power wires") included in the copper twisted-pair cable used to connect each connector assembly 202 to the associated inter-networking device.

Figure 3:
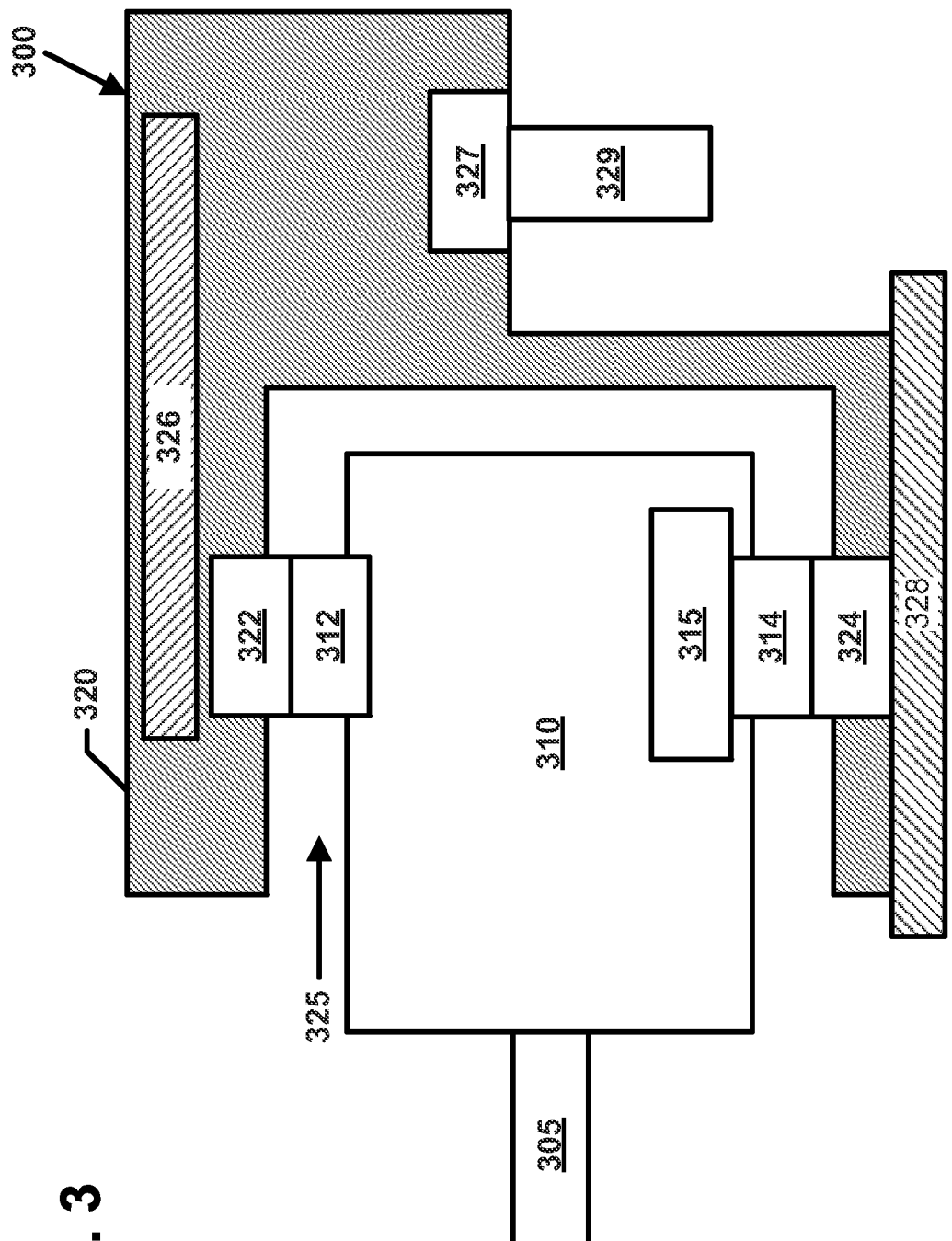
FIG. 3 is a block diagram of one high-level example of a port and media reading interface that are suitable for use in the management system of FIG. 2 in accordance with aspects of the present disclosure.

FIG. 3 is a schematic diagram of one example connection system 300 including a connector assembly 320 configured to collect physical layer information from a connector arrangement 310. The example connection system 300 shown includes a jack module 320 and an electrical plug 310. The connector arrangement 310 terminates at least a first electrical segment (e.g., a conductor cable) 305 of physical communications media and the connector assembly 320 terminates at least second electrical segments (e.g., twisted pairs of copper wires) 329 of physical communications media. The connector assembly 320 defines at least one socket port 325 in which the connector arrangement 310 can be accommodated.

Each electrical segment 305 of the connector arrangement 310 carries communication signals (e.g., communications signals S1 of FIG. 1) to primary contact members 312 on the connector arrangement 310. The connector assembly 320 includes a primary contact arrangement 322 that is accessible from the socket port 325. The primary contact arrangement 322 is aligned with and configured to interface with the primary contact members 312 to receive the communications signals (S1 of FIG. 1) from the primary contact members 312 when the connector arrangement 310 is inserted into the socket 325 of the connector assembly 320.

The connector assembly 320 is electrically coupled to one or more printed circuit boards. For example, the connector assembly 320 can support or enclose a first printed circuit board 326, which connects to insulation displacement contacts (IDCs) 327 or to another type of electrical contacts. The IDCs 327 terminate the electrical segments 329 of physical communications media (e.g., conductive wires). The first printed circuit board 326 manages the primary communication signals carried from the conductors terminating the cable 305 to the electrical segments 329 that couple to the IDCs 327.

In accordance with some aspects, the connector arrangement 310 can include a storage device 315 configured to store physical layer information. The connector arrangement 310 also includes second contact members 314 that are electrically coupled (i.e., or otherwise communicatively coupled) to the storage device 315. In one implementation, the storage device 315 is implemented using an EEPROM (e.g., a PCB surface-mount EEPROM). In other implementations, the storage device 315 is implemented using other non-volatile memory device. Each storage device 315 is arranged and configured so that it does not interfere or interact with the communications signals communicated over the media segment 305.

The connector assembly 320 also includes a second contact arrangement (e.g., a media reading interface) 324. In certain implementations, the media reading interface 324 is accessible through the socket port 325. The second contact arrangement 324 is aligned with and configured to interface with the second contact members 314 of the media segment to receive the physical layer information from the storage device 315 when the connector arrangement 310 is inserted into the socket 325 of the connector assembly 320.

In some such implementations, the storage device interfaces 314 and the media reading interfaces 324 each comprise three (3) leads—a power lead, a ground lead, and a data lead. The three leads of the storage device interface 314 come into electrical contact with three (3) corresponding leads of the media reading interface 324 when the corresponding media segment is inserted in the corresponding port 325. In certain example implementations, a two-line interface is used with a simple charge pump. In still other implementations, additional leads can be provided (e.g., for potential future applications). Accordingly, the storage device interfaces 314 and the media reading interfaces 324 may each include four (4) leads, five (5) leads, six (6) leads, etc.

The storage device 315 also may include a processor or micro-controller, in addition to the storage for the physical layer information. In some example implementations, the micro-controller can be used to execute software or firmware that, for example, performs an integrity test on the cable 305 (e.g., by performing a capacitance or impedance test on the sheathing or insulator that surrounds the cable 305, (which may include a metallic foil or metallic filler for such purposes)). In the event that a problem with the integrity of the cable 305 is detected, the micro-controller can communicate that fact to a programmable processor (e.g., processor 206 of FIG. 2) associated with the port using the storage device interface (e.g., by raising an interrupt). The micro-controller also can be used for other functions.

The connector assembly 320 also can support or enclose a second printed circuit board 328, which connects to the second contact arrangement 324. The second printed circuit board 328 manages the physical layer information communicated from a storage device 315 through second contacts 314, 324. In the example shown, the second printed circuit board 328 is positioned on an opposite side of the connector assembly 320 from the first printed circuit board 326. In other implementations, the printed circuit boards 326, 328 can be positioned on the same side or on different sides. In one implementation, the second printed circuit board 328 is positioned horizontally relative to the connector assembly 320 (see FIG. 3). In another implementation, the second printed circuit board 328 is positioned vertically relative to the connector assembly 320.

The second printed circuit board 328 can be communicatively connected to one or more programmable electronic processors and/or one or more network interfaces. In one implementation, one or more such processors and interfaces can be arranged as components on the printed circuit board 328. In another implementation, one of more such processor and interfaces can be arranged on a separate circuit board that is coupled to the second printed circuit board 328. For example, the second printed circuit board 328 can couple to other circuit boards via a card edge type connection, a connector-to-connector type connection, a cable connection, etc. The network interface is configured to send the physical layer information to the data network (e.g., see signals S2 o f FIG. 1).

FIGS. 4-19 provide an example implementation of physical layer management networks and components for electrical (e.g., copper) communications applications. FIGS. 4-8 show an example of a connector arrangement 3000 in the form of a modular plug 3002 for terminating an electrical communications cable. FIGS. 9-19 show an example connector assembly 3100 in the form of a patch panel 3102 defining at least one socket 3106, which can receive the connector arrangement 3000 for signal transmission.

In accordance with one aspect, the connector arrangement 3000 includes an RJ plug 3002 that connects to the end of an electrical segment of communications media, such as twisted pair copper cable. The socket 3106 of the connector assembly 3100 defines an RJ jack (e.g., an RJ-45 jack). In the example shown, the RJ plug 3002 is insertable into a port of a mating RJ jack 3106 in the patch panel 3102 of the connector assembly 3100 as will be described below. In accordance with other aspects, however, the connector arrangement 3000 and connector assembly 3100 can define other types of electrical connections.

In the example shown, the plug 3002 includes a plug nose body 3004 for holding main signal contacts 3012, which are electrically connected to segments of communications media terminated at the plug 3002. For example, the main contacts 3012 may be connected to twisted pair conductors of a communications cable. In one implementation, the main signal contacts 3012 are arranged at a front end 3014 of the plug 3002. The main signal contacts 3012 are positioned to electrically connect to contacts positioned in the jack 3106 for signal transmission.

The plug 3002 further includes a finger tab 3050, which facilitates latching the connector arrangement 3000 to the connector assembly 3100. The finger tab 3050 includes a latch surface 3052 for latching to the connector assembly 3100. In some implementations, the finger tab 3050 extends from the plug nose body 3004.

Certain types of plugs 3002 also include a keying structure 3015 that is shaped to mate with a keyway 3065 defined in the connector assembly 3100. In certain implementations, the keying structure 3015 is formed at a base of the finger tab 3050. Certain types of plugs 3002 also include wire managers 3008 for managing the electrical segments of communications media (e.g., twisted wire pairs) and a strain relief boot 3010 which snaps to the plug nose body 3004.

Figure 4:
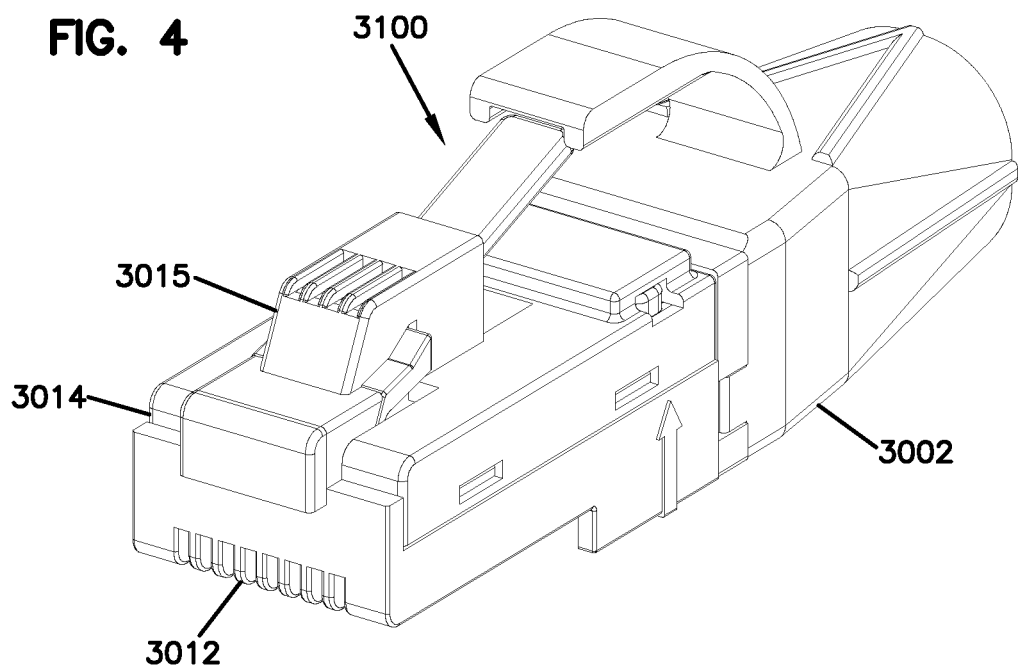
FIG. 4 is a perspective view of an example connector arrangement in the form of a modular RJ plug in accordance with the principles of the present disclosure.
Figure 5:
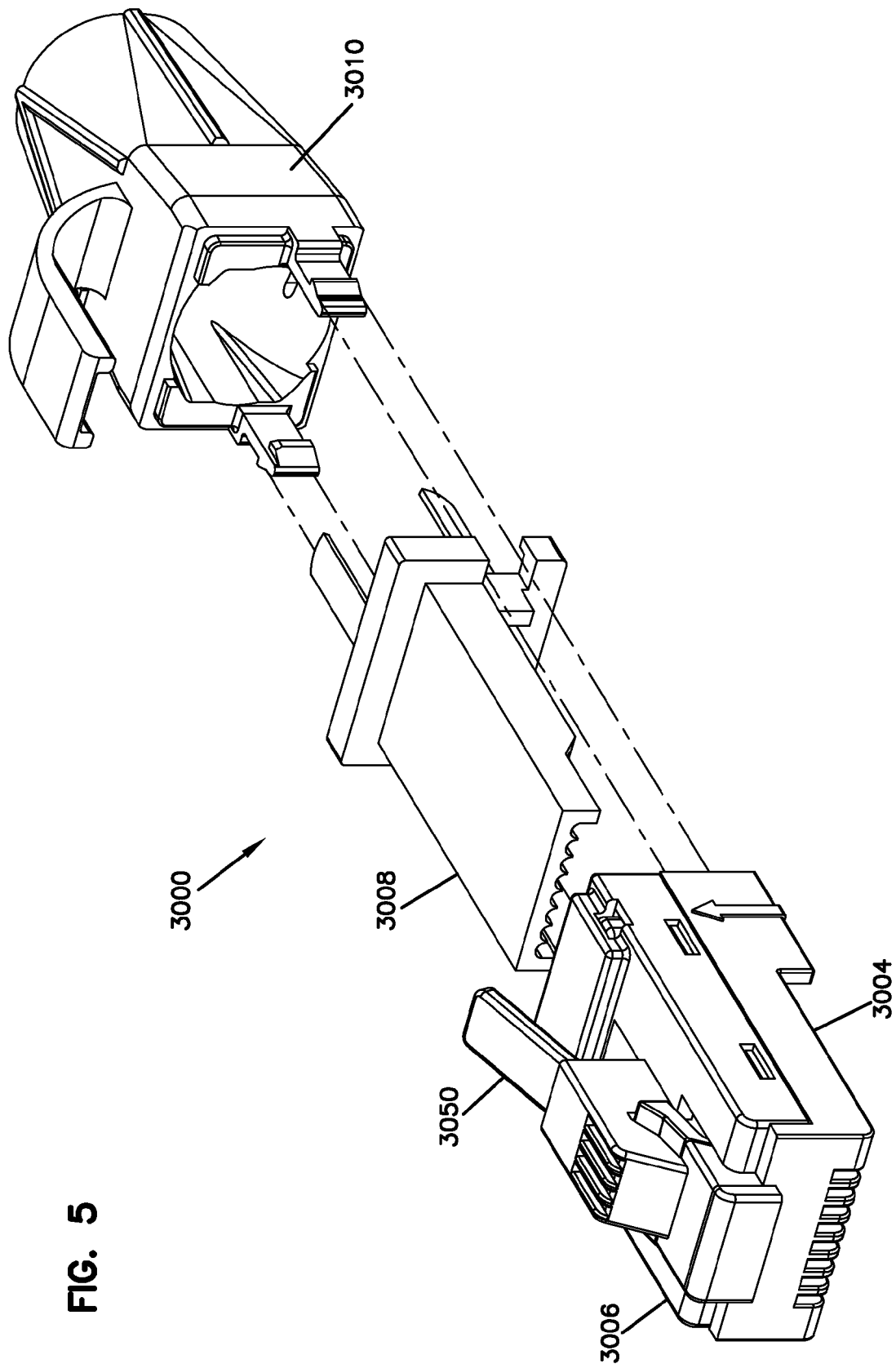
FIG. 5 is an exploded perspective view of the modular RJ plug of FIG. 5 in accordance with the principles of the present disclosure.
Figure 6:
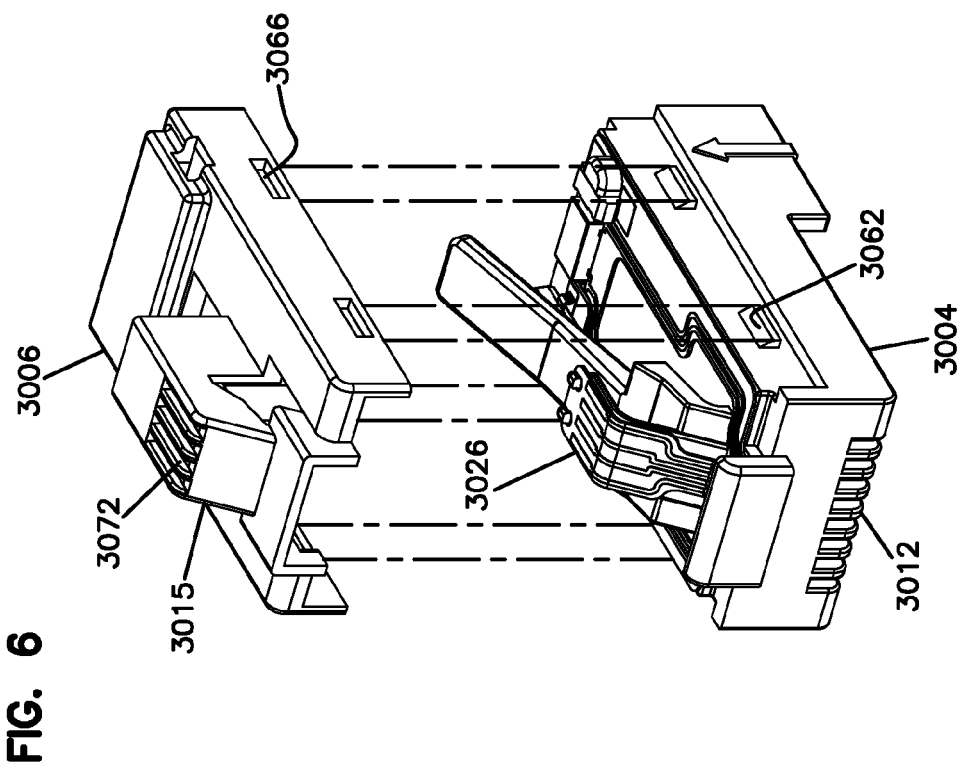
FIG. 6 is a further exploded perspective view of the modular RJ plug of FIG. 5 in accordance with the principles of the present disclosure.

The plug 3002 also includes a plug cover 3006 that mounts on the plug nose body 3004 (see FIGS. 4-6). For example, in certain implementations, the plug cover 3006 defines side opening 3066 for receiving the side tabs 3062 defined on the plug nose body 3004. Certain types of plug covers 3006 mount over the finger tab 3050. For example, the plug cover 3006 may defines a cavity, slot, or recess for receiving the finger tab 3050.

The connector arrangement 3000 also includes a storage device 3030 (FIGS. 6 and 7) that is configured to store physical layer information (e.g., an identifier and/or attribute information) pertaining to the segment of physical communications media (e.g., the plug 3002 and/or the electrical cable terminated thereby). The storage device 3030 is electrically connected to one or more second contacts 3026. Certain types of connector arrangements 3000 also can include additional components to aid in physical layer management.

Figure 7:
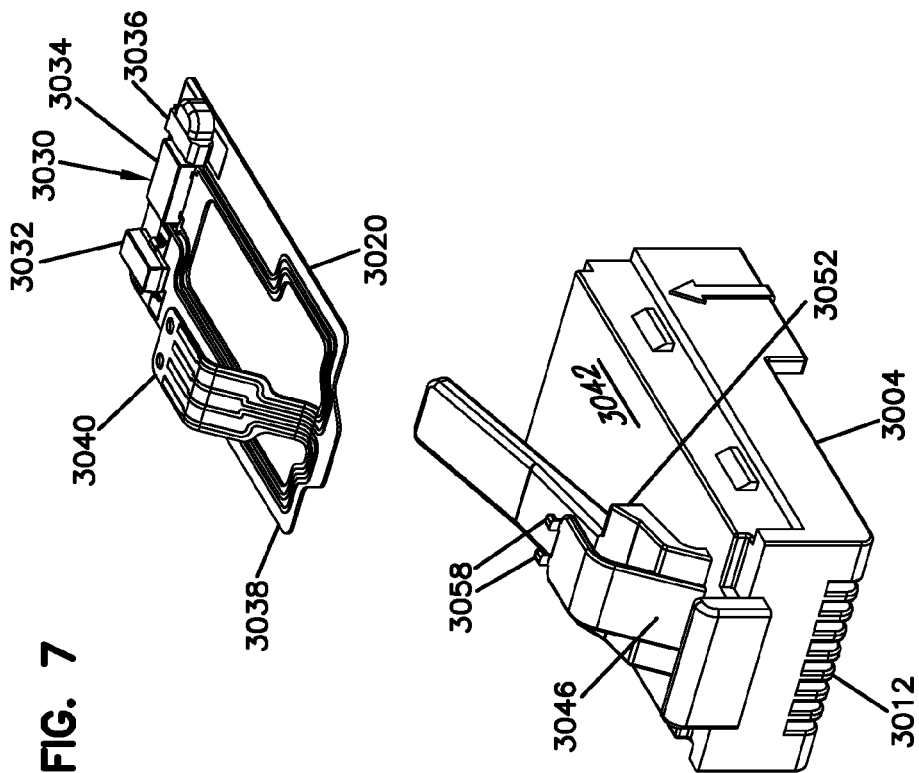
FIG. 7 is a still further exploded perspective view of the modular RJ plug of FIG. 5 in accordance with the principles of the present disclosure.

FIG. 7 is an exploded view of a plug component 3003 including the storage device 3030 and plug nose body 3004. In some implementations, the second contacts 3026 are located within the keying structure 3015. In certain implementations, the keying structure 3015 defines slotted openings (e.g., see slotted openings 3072 of FIG. 4) providing access to the second contacts 3026 (see FIG. 6). For example, in one implementation, the plug cover 3006 defines the slotted openings 3072 for contacts 3026 to be exposed for contact with mating contacts of a media reading interface 3188 of the connector assembly 3100.

In one implementation, the connector arrangement 3000 also can include a communications device 3036 that is configured to send and receive communications signals to and from a local source. For example, the communications device 3036 can include an IR transceiver. Such a communications device 3036 can enable a technician to read and/or write data to the storage device 3030 using an infra-red wand or probe (e.g., a handheld wand or probe). Accordingly, the technician can access information stored on the connector arrangement 3000 without plugging the connector arrangement 3000 into a port of connector assembly 3100.

Figure 8:
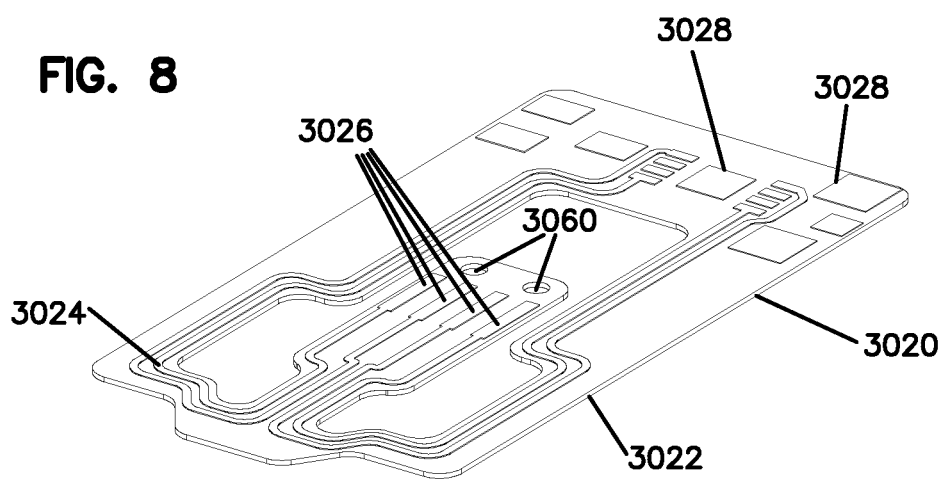
FIG. 8 is a perspective view of an example flexible circuit of the modular RJ plug of FIG. 5 in accordance with the principles of the present disclosure.

In some implementations, the storage device 3030 can be arranged on a circuit 3020 (FIG. 8) that is mounted to the modular plug 3002 (see FIGS. 7-8). In certain implementations, the circuit 3020 is positioned between plug nose body 3004 and plug cover 3006. In the example shown in FIG. 6, at least a portion of the circuit 3020 is located within the keying structure 3015. In certain implementations, additional components, such as the communications device 3036, can be arranged on the circuit 3020.

In the example shown in FIG. 8, the circuit 3020 includes a substrate 3022 with conductive traces 3024 connecting lands 3028 to the second contacts 3026 (e.g., see FIGS. 6-8). The circuit 3020 also includes circuit components, including the media storage device 3030, installed at the lands 3028. The storage device 3030 may be accessed via the second contacts 3026. In the example shown in FIG. 7, the storage device 3030 includes an electrically erasable programmable read-only memory (EEPROM) 3034. In other implementations, however, the storage device 3030 can include any suitable type of memory. In certain implementations, the circuit components also may include a metal-oxide-semiconductor field-effect transistor (MOSFET) 3032.

In accordance with some aspects, the circuit 3020 is a flexible circuit that defines a base portion 3038 and an extending portion 3040. The MOSFET 3032, the EEPROM 3034, and the IR device 3036 can be mounted to the base portion 3038. The circuit contacts 3026 can be arranged on the extending portion 3040. In some implementations, the extending portion 3040 is located within the keying structure 3015. In certain implementations, the extending portion 3040 is located on the finger tab 3050. The circuit contacts 3026 permit connection of the EEPROM 3034 to a media reading interface 3188 of the connector assembly 3100 as will be disclosed herein.

In the example shown, the flexible circuit 3020 is positioned along an outer surface 3042 of plug nose body 3004. In the example shown, the extending portion is positioned on the same side of the plug as the finger tab 3050. The base portion 3038 of the flexible circuit 3020 is positioned along a periphery of surface 3042. Extending portion 3040 is positioned over a flexible rib 3046 of plug nose body 3004. Rib 3046 supports flexible circuit 3020 in the area of extending portion 3040 so that contacts 3026 are positioned to engage the media reading interface 3188 associated with the connector assembly 3100. Rib 3046 includes retainer pegs 3058 for engaging holes 3060 on extending portion 3040 of the flexible circuit 3020 for retention.

Referring now to FIGS. 9-19, an example connector assembly 3100 is shown. In the example shown, the connector assembly 3100 forms a patch panel 3102 for rack or frame mounting and defines a plurality of ports 3104. Connector assembly 3100 includes a plurality of modular RJ jack modules (e.g., RJ 45 jack modules) 3106 which snap-fit to connector assembly 3100 to define the ports 3104. RJ jack modules 3106 connect to twisted pair cables, or other signal transmission structures, such as PCBs. A front opening 3110 of each jack module 3106 receives the front end 3014 (FIG. 4) of the plug 3002 to enable main signal transmission from the cable through jack module 3106 to another cable or other signal transmission media. Certain types of jack modules 3106 are configured to latchingly receive the finger tab 3050 to secure the plug 3002 to the jack module 3106.

The connector assembly 3100 also includes a media reading interface 3188 (FIGS. 11 and 17) that permits reading (e.g., by a processor) of the information stored in the storage device 3030 of the connector arrangement 3000. The information read from the storage device 3030 can be transferred to a physical layer management network (e.g., network 101 of FIG. 1, network 218 of FIG. 2, etc.). In some examples, the circuitry associated with storage device 3030 and the circuitry associated with media reading interface 3188 does not affect the main signal interface between the plug and the jack.

Figure 9:
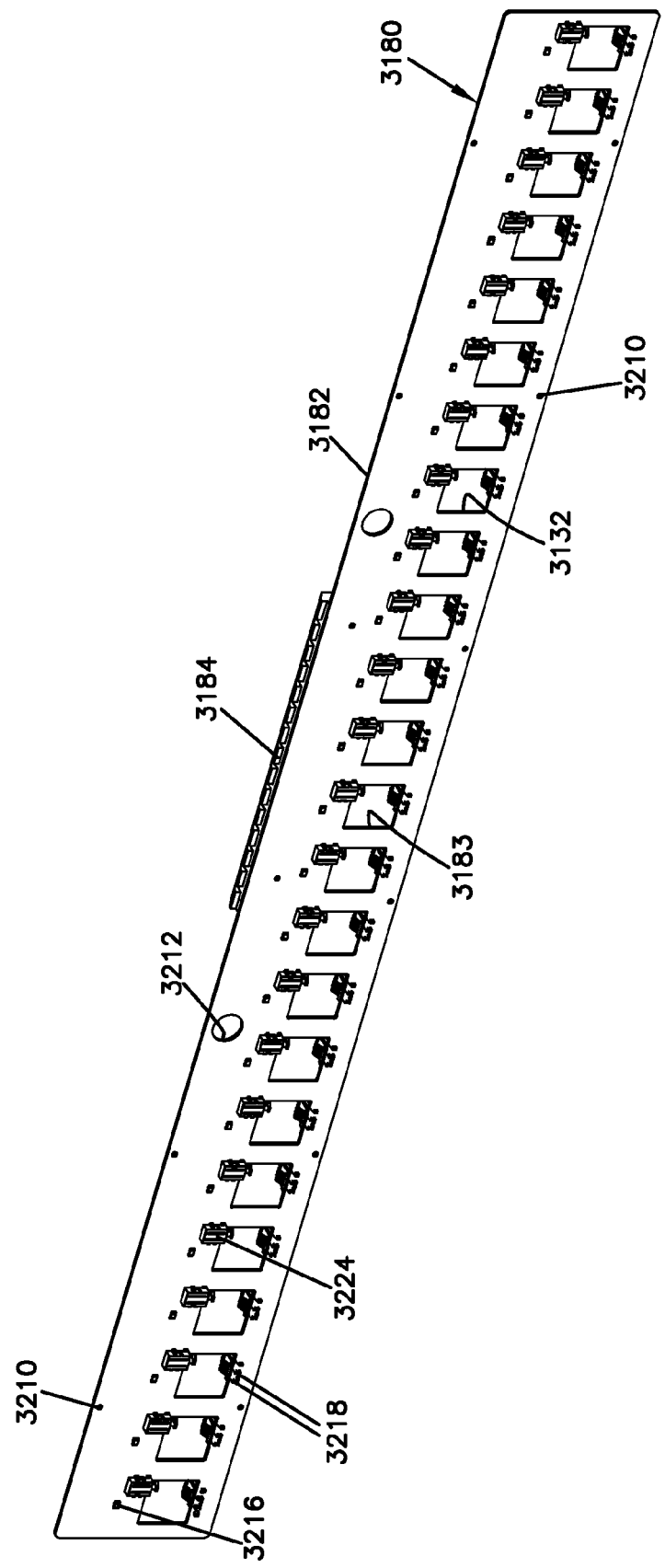
FIGS. 9-19 show an example connector assembly in the form of a patch panel defining at least one socket, which can receive the connector arrangement for signal transmission in accordance with the principles of the present disclosure.
Figure 10:
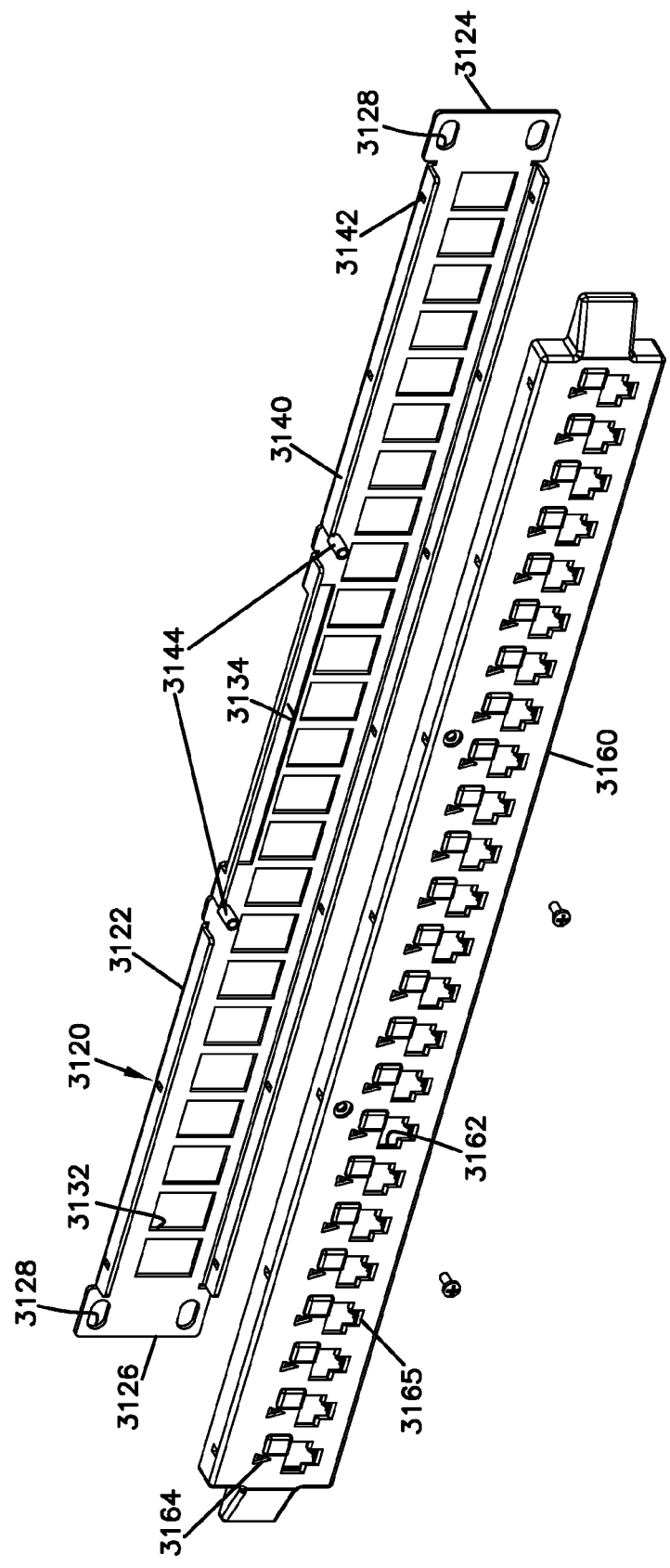

In the example shown, the patch panel 3102 includes circuitry 3180 (FIG. 9) mounted to a frame 3120 and a front panel or fascia 3160 (see FIG. 10). In certain implementations, the circuitry 3180 is enclosed between the frame 3120 and the fascia 3160. Certain types of circuitry 3180 include a main PCB 3182 (FIG. 9). In certain implementations, the main PCB 3182 is mounted to the fascia 3160, which is mounted to the frame 3120. The main PCB 3182 defines openings 3183 that align with ports of the jack modules 306. Each opening is configured to enable passage of a modular plug 3002 through the PCB 3182 and into one of the modular jacks 3106 (e.g., see FIGS. 17-18).

Figure 11:
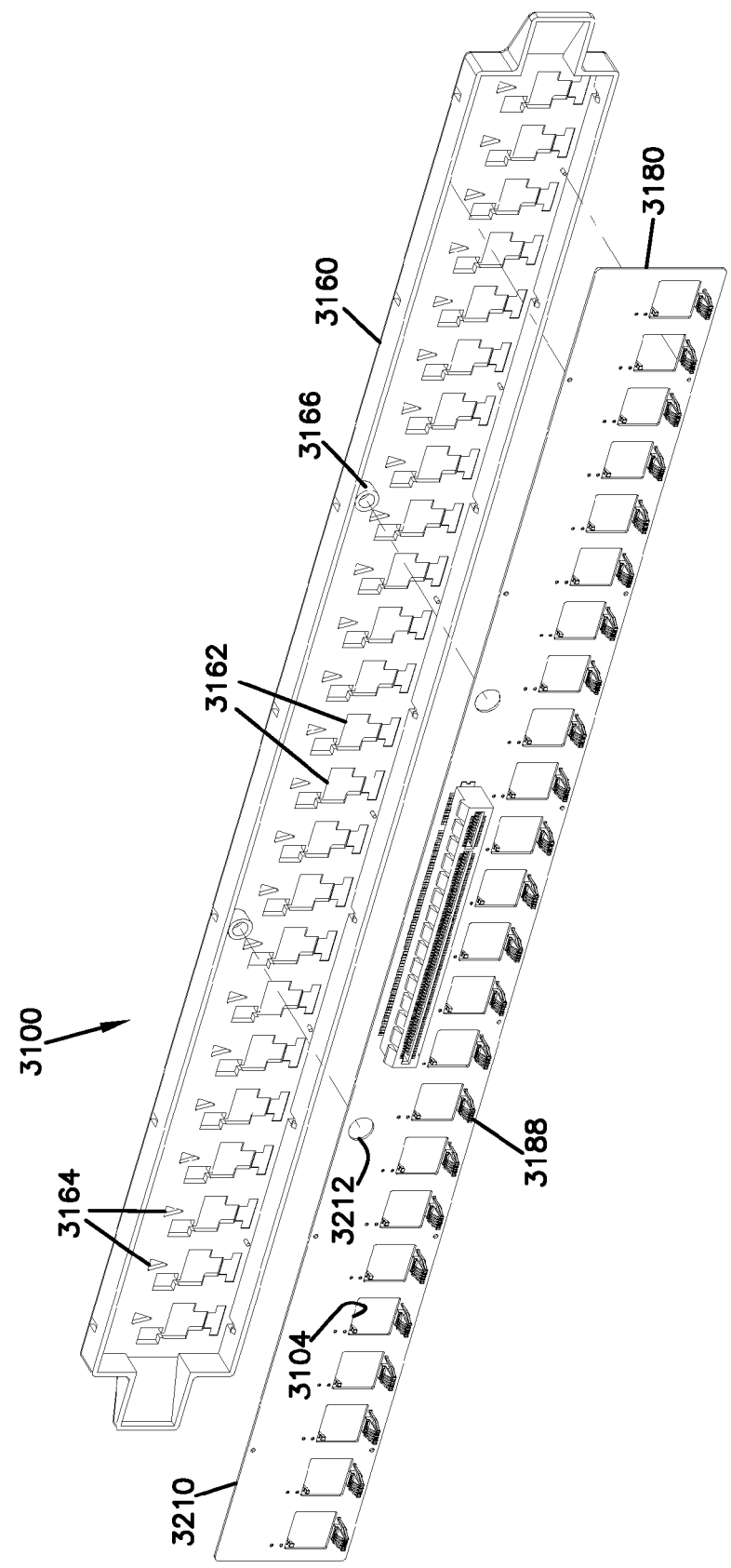
Figure 12:
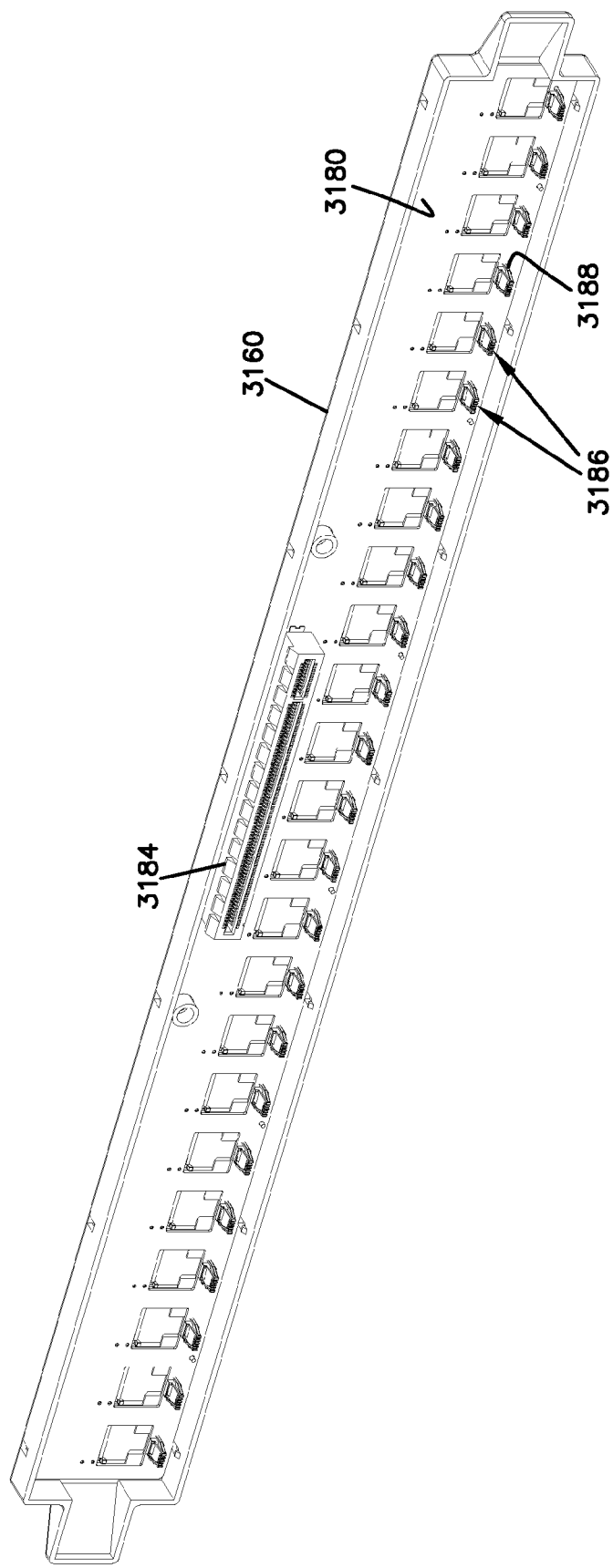
Figure 13:
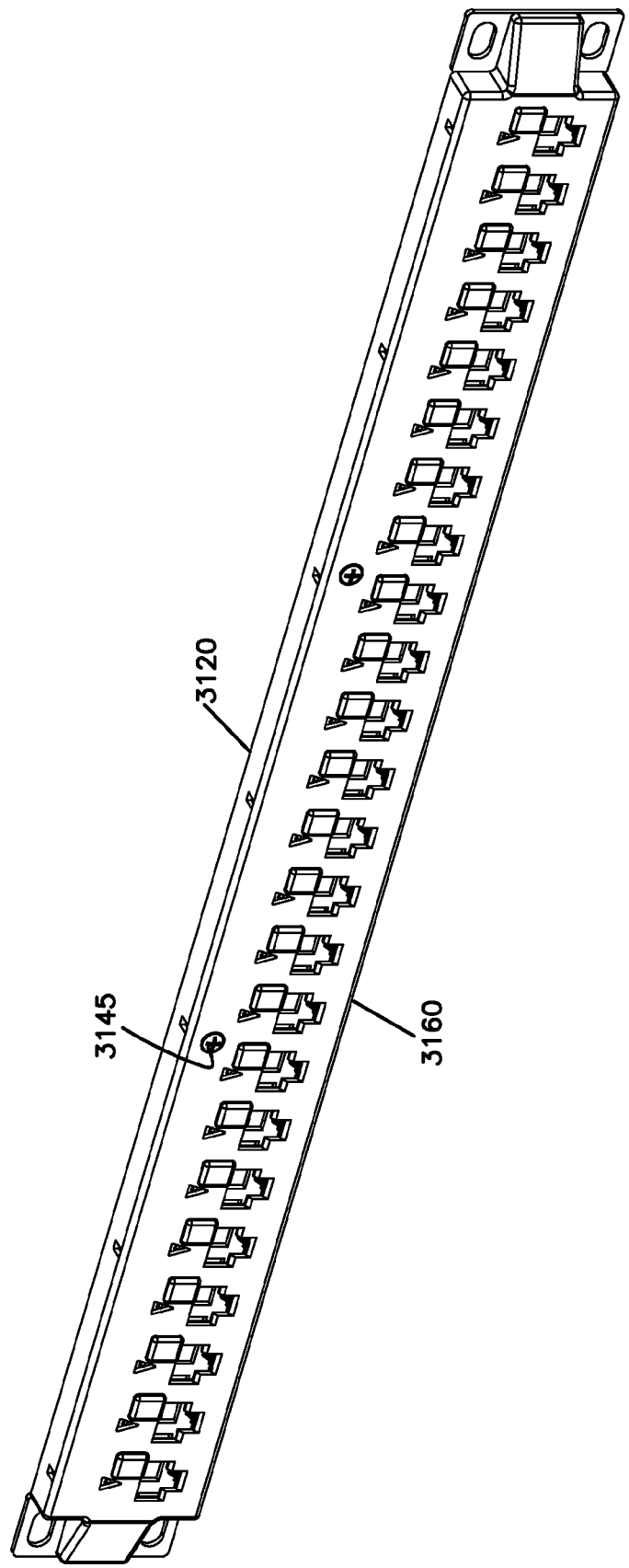
Figure 14:
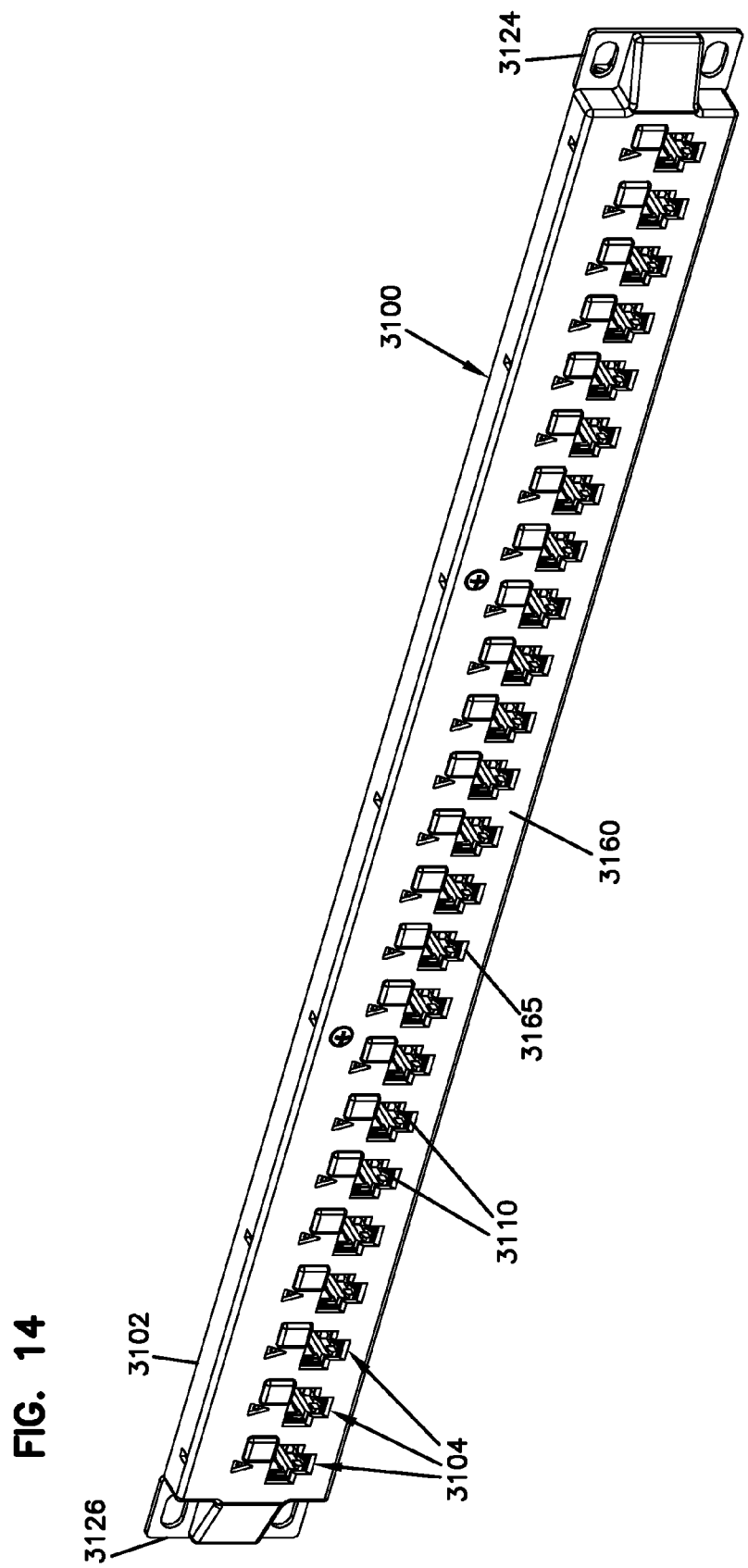
Figure 15:
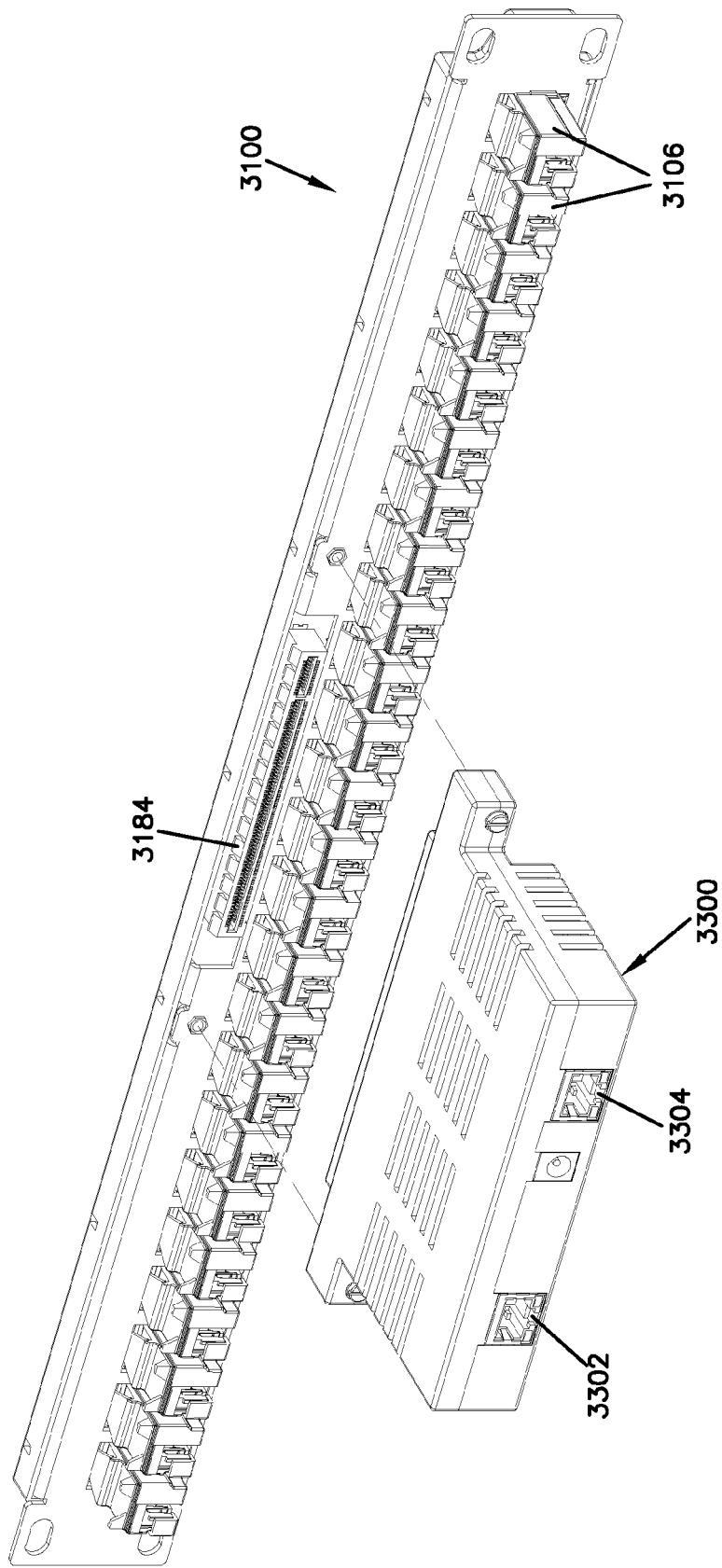
Figure 16:
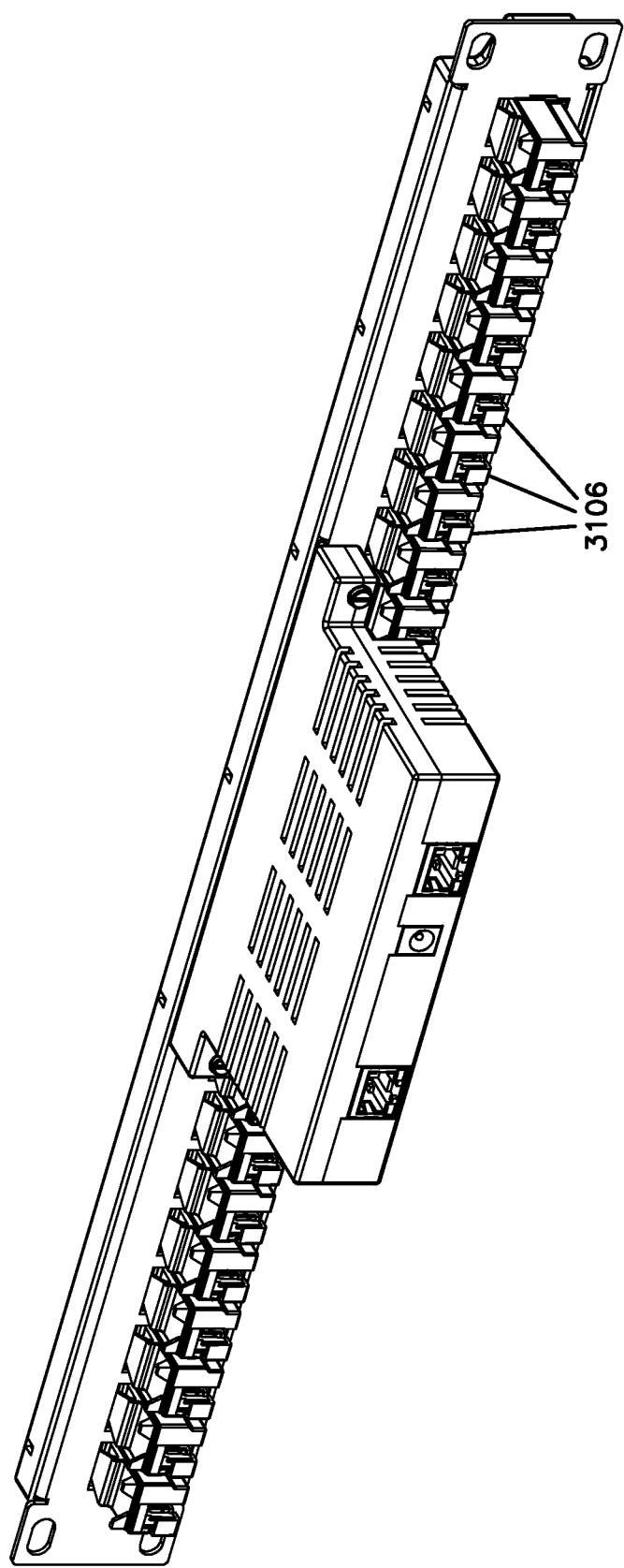
Figure 17:
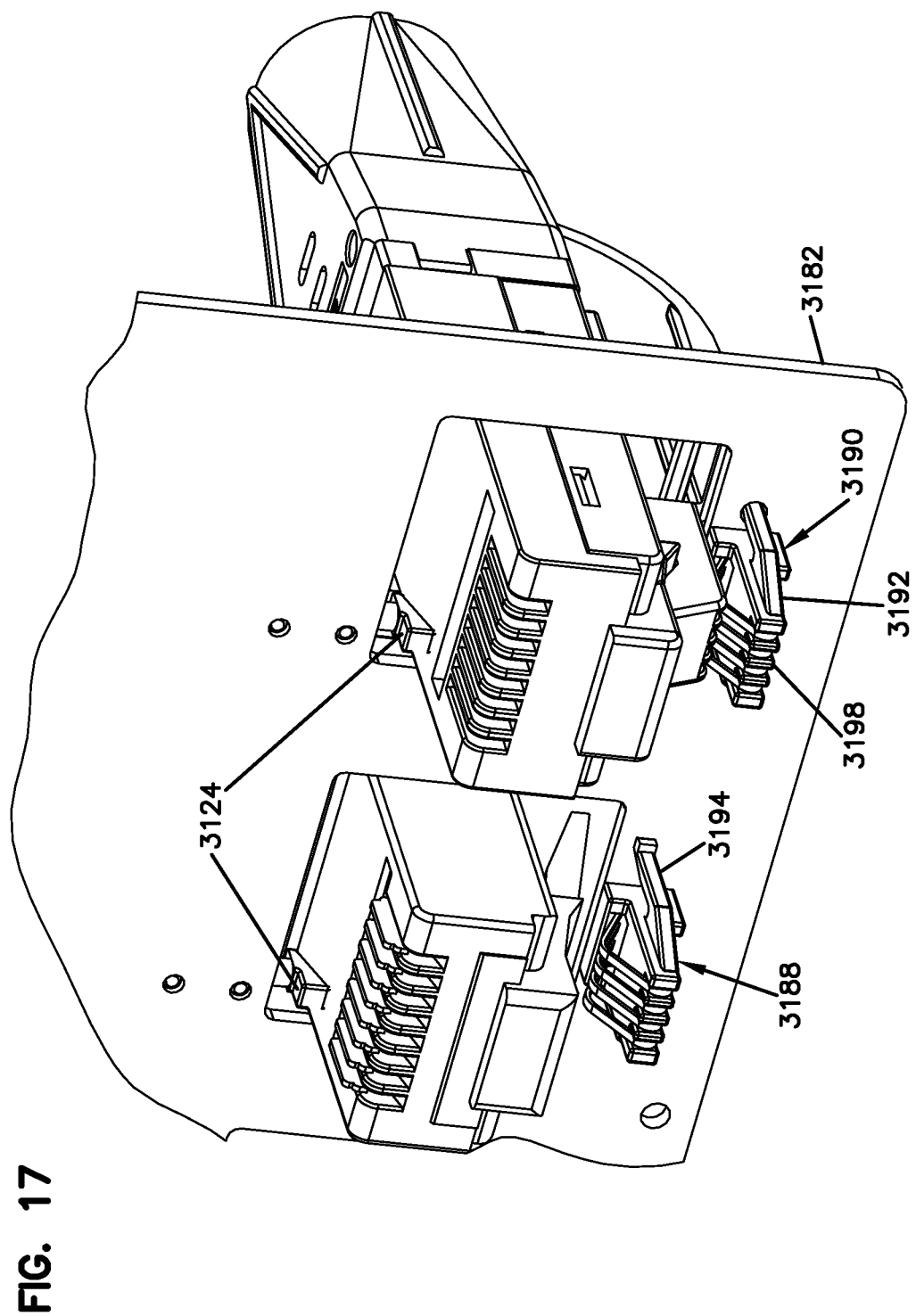
Figure 18:
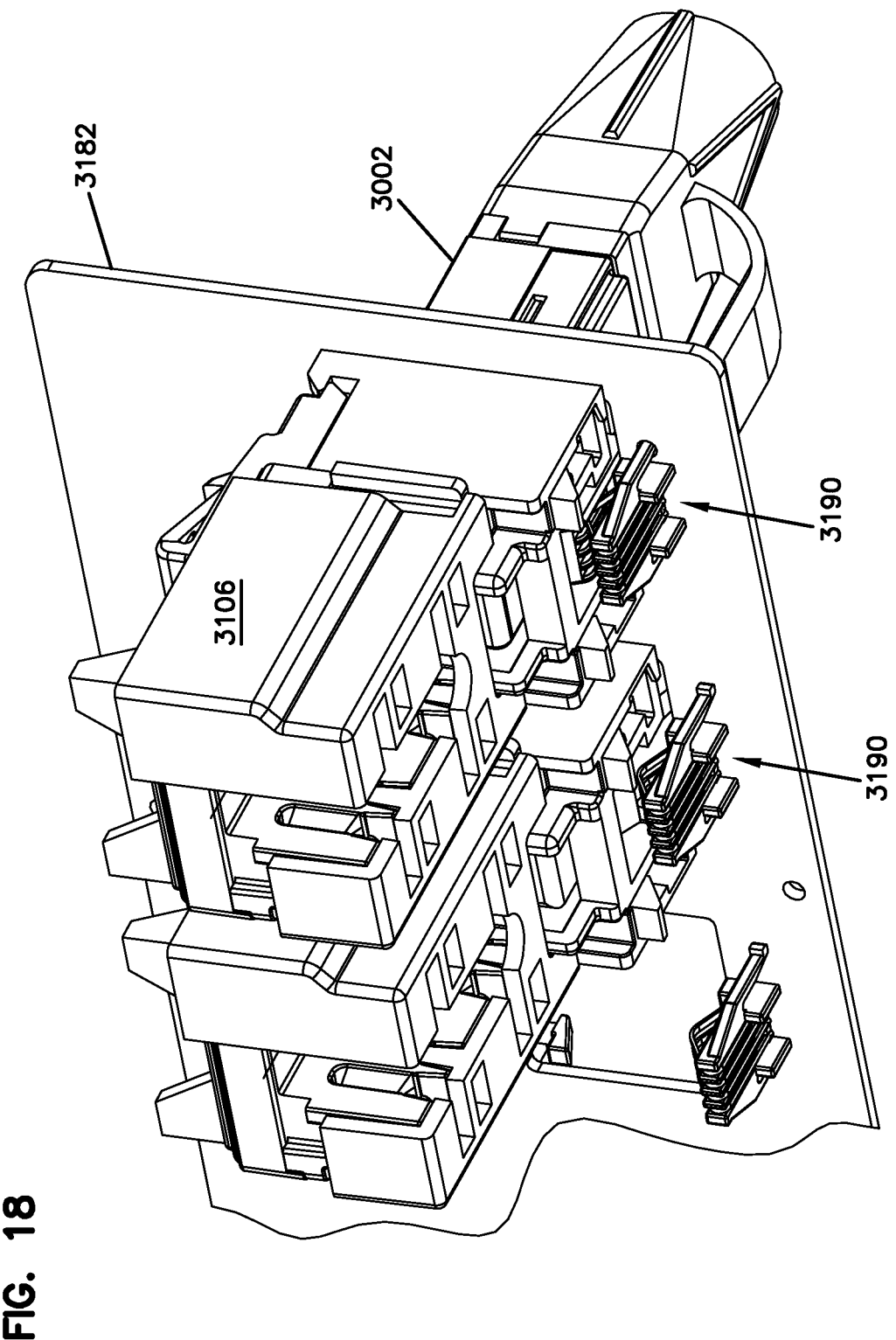

The main PCB 3182 includes a main communications interface connector 3184 and jack interface connectors 3186 (see FIGS. 11-12). Jack interface connectors 3186 form the media reading interface 3188 for connector assembly 3100. In the example shown in FIGS. 17-18, the jack interface connectors 3186 include a contact set 3190 having a body 3192 and projections 3194 for connecting to the main PCB 3182 through holes 3218 defined in the PCB 3182. Contact set 3190 includes a plurality of conductive contacts 3198. In accordance with some aspects, PLM functionality can be retrofitted to existing systems. For example, conventional jack modules can be snap-fitted into a frame 3120 coupled to a main PCB 3182 as described above.

The main PCB 3182 also defines holes 3210 (FIG. 9) for heat staking main PCB 3182 to front panel 3160 (e.g., see FIG. 12). Locator holes 3212 align with posts 3166 of front panel 3160 to facilitate assembly of the PCB 3182 to front panel 3160 (see FIG. 11). In certain implementations, the circuitry 3180 includes an LED indicator 3216 adjacent each opening 3183 of the PCB 3182. In the example shown, each LED indicator 3216 is a bi-color indicator. In certain implementations, a microswitch 3124 (FIG. 17) can be mounted to the PCB 3182 adjacent to each opening 3183 for sensing the presence of a connector arrangement 3000 inserted into the corresponding jack 3106.

The frame 3120 includes a main portion 3122 and ends 3124, 3126. Each end 3124, 3126 of the frame 3120 includes holes 3128 to mount frame 3120 to a rack. The main portion 3122 of the frame 3120 includes upper and lower flanges 3140. Tabs 3142 on the flanges 3140 cooperate with a complementary mating structure on the fascia 3160 to connect the fascia 3160 to the frame 3120 (see FIG. 13). Standoffs 3144 accept screws 3145 or other fasteners for mounting the front panel 3160 to the frame 3120.

The main portion 3122 of the frame 3120 defines one or more openings 3132 configured to receive the jack modules 3106. Frame 3120 also defines a second aperture 3134 (FIG. 10) configured to receive the communications interface connector 3184 (e.g., see FIG. 15). The front panel 3160 defines openings 3162 that align with openings 3110 of the jack modules 3106 when the jack modules 3106 are mounted to the frame 3120. Plugs 3002 of the connector arrangement 3000 can be inserted through the openings 3162 and into the jacks 3106. The front panel 3160 also defines openings 3164 for the passage of light signals from the LED indicators 3216 of the internal circuitry 3180.

In certain implementations, each opening 3162 of the front panel 3160 defines a keyway 3165 shaped to receive the keying structure 3015 of the connector arrangement 3000. In the example shown in FIGS. 10 and 14, each opening 3162 defines a recessed keyway 3165 extending downwardly. The finger tabs 3050 of certain types of connector arrangements 3000 are configured to latch in the keyway 3165. In one implementation, the opening 3162 and keyway 3165 are generally T-shaped (e.g., see FIG. 10).

In general, the media reading interfaces 3188 align with the openings 3162 of the front panel 3160. In certain implementations, the media reading interfaces 3188 are positioned adjacent the keyways 3165 (e.g., see FIG. 12). For example, in one implementation, each media reading interface 3188 can be positioned beneath one of the keyways 3165 at the front panel openings 3162. In certain implementations, second contacts 3026 located within the keying structure 3015 of the connector arrangement 3000 interface with the media reading interface 3188 when the connector arrangement 3000 is inserted through the opening 3162 of the front panel 3160 and into the jack module 3110. For example, contacts of the media reading interface 3188 may extend through the slots 3072 of the connector arrangement 3000.

Figure 19:
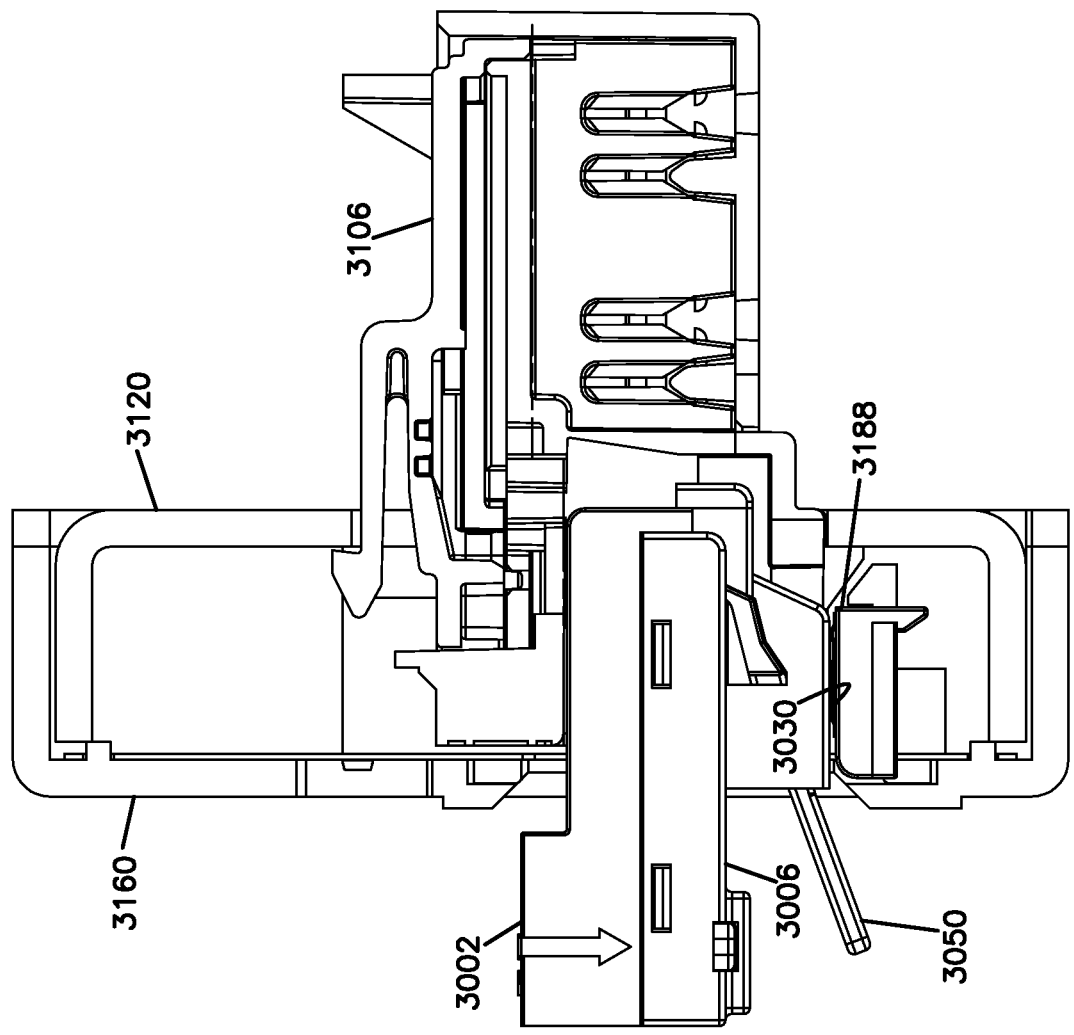

FIG. 19 shows an example connector arrangement 3000 being inserted into an example connector assembly 3100. Once connected, information is read from media storage device 3030 of the connector arrangement 3000 by a CPU card 3300 connected to main communications interface connector 3184 (see FIG. 16). The CPU card 3300 includes circuitry and components including a processor that is configured to read information obtained from the storage device 3030 of the connector arrangement 3000. Communications ports 3302, 3304 of the CPU card 3300 can be connected to the physical layer management network. A power port 3306 also can be defined by the CPU card 3300.

Figure 20:
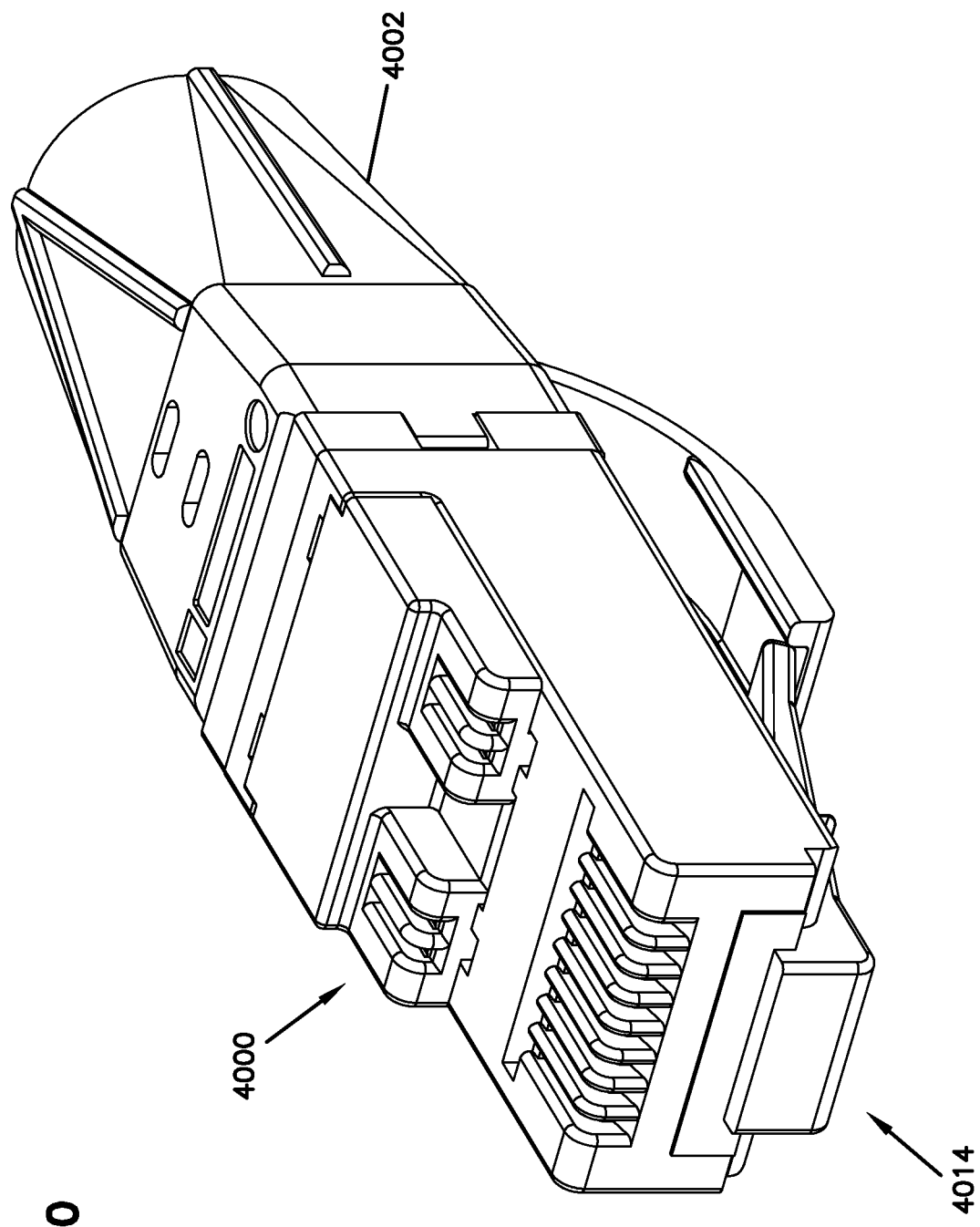
FIGS. 20-22 show another example of a connector arrangement in the form of a modular plug for terminating an electrical communications cable in accordance with the principles of the present disclosure.
Figure 21:
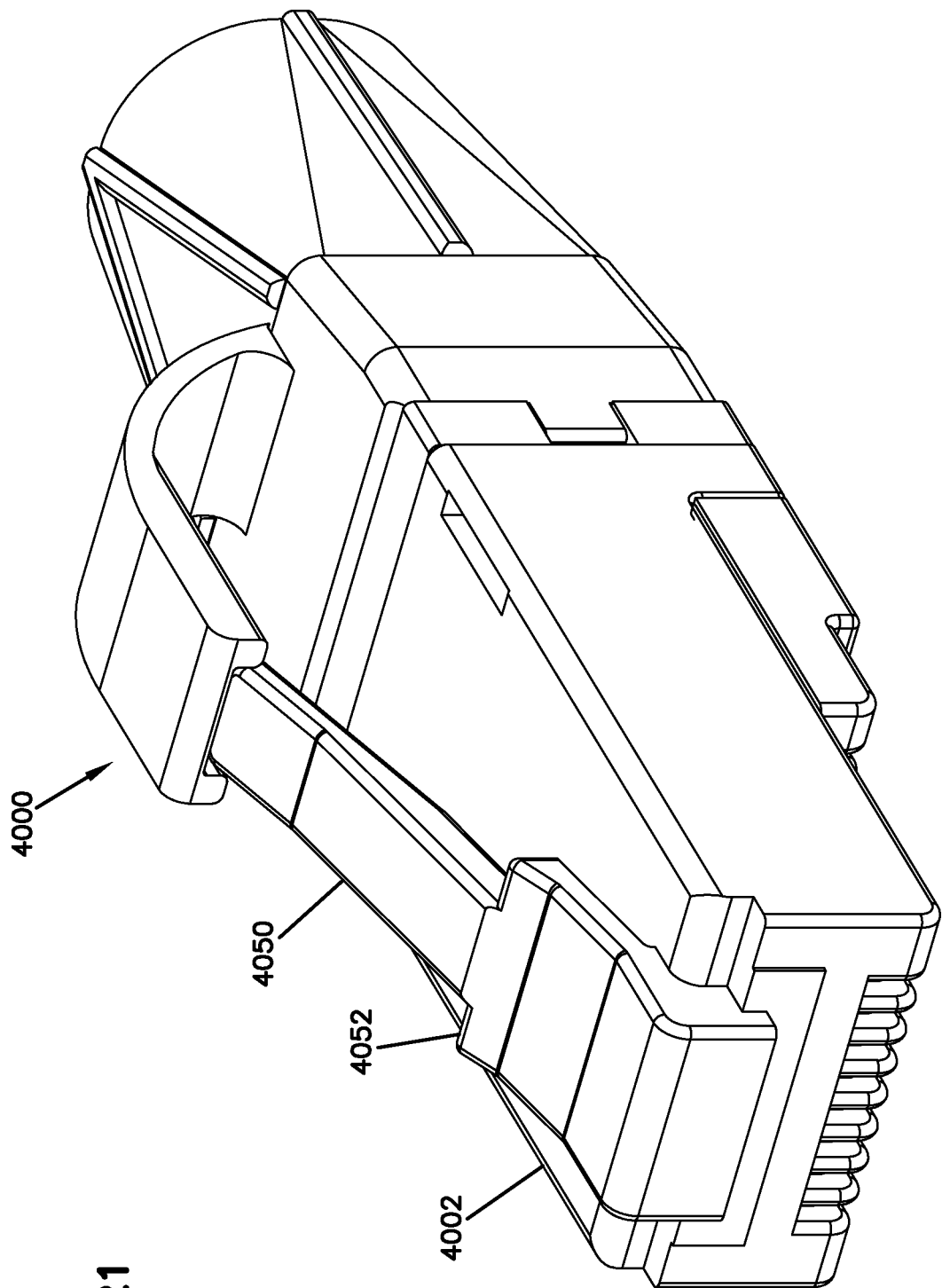
Figure 22:
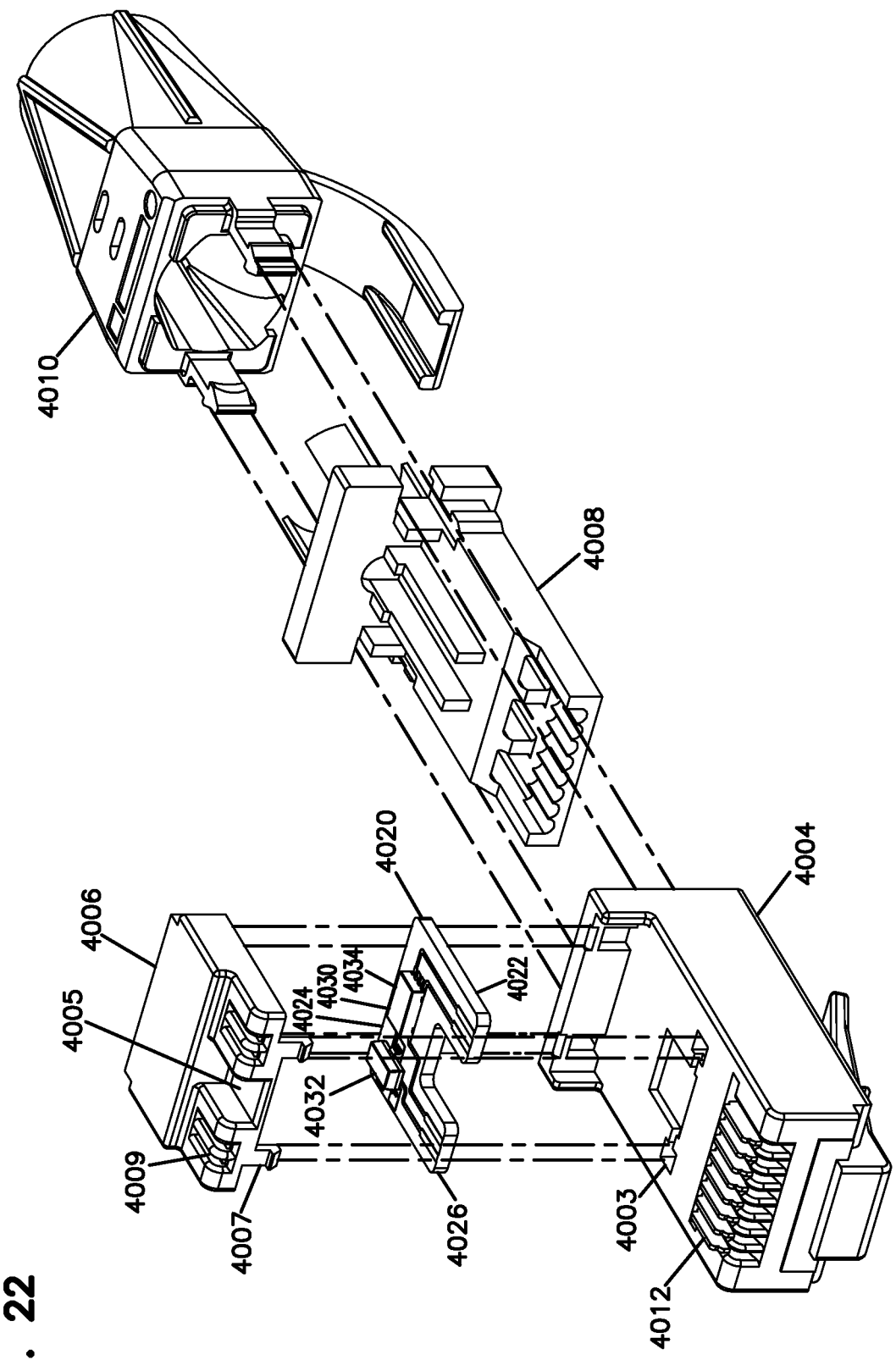

FIGS. 20-38 provide another example implementation of physical layer management networks and components for electrical (e.g., copper) communications applications. FIGS. 20-22 show another example of a connector arrangement 4000 in the form of a modular plug 4002 for terminating an electrical communications cable (not shown). FIGS. 23-38 show an example connector assembly 4100 and components thereof. In the example shown, the connector assembly 4100 is in the form of a patch panel 4102 defining at least one socket 4106, which can receive the connector arrangement 4000 for signal transmission.

In accordance with one aspect, the connector arrangement 4000 includes an RJ plug 4002 that connects to the end of an electrical segment of communications media, such as twisted pair copper cable (not shown). In the example shown, the RJ plug 4002 is insertable into a port of a mating RJ jack (e.g., an RJ-45 jack) 4106 in the patch panel 4102 of the connector assembly 4100 as will be described below (see FIG. 38). In accordance with other aspects, however, the connector arrangement 4000 and connector assembly 4100 can define other types of electrical connections.

In the example shown, the plug 4002 includes a plug nose body 4004 (FIG. 22) for holding main signal contacts 4012, which are electrically connected to the twisted pair conductors of the communications cable. In one implementation, the main signal contacts 4012 are arranged at a front end 4014 of the plug 4002. The main signal contacts 4012 electrically connect to contacts positioned in the jack module 4106 for signal transmission. The plug nose body 4004 further includes a finger tab 4050, which facilitates latching the connector arrangement 4000 to the connector assembly 4100. The finger tab 4050 includes a latch surface 4052 for latching to the connector assembly 4100.

The plug 4002 also includes a plug cover 4006 that mounts on the plug nose body 4004 (see FIG. 22). In the example shown, the plug cover 4006 mounts to an opposite side of the plug nose body 4004 from which the finger tab 4050 extends. The plug cover 4006 defines latch arms 4007 configured to be received in openings 4003 defined in the plug nose body 4004. The plug cover 4006 also defines a plurality of slotted openings 4009 for circuit contacts to be exposed for contact with mating contacts 4190 of the media reading interface 4188 of the connector assembly 4100. In the example shown, the plug cover 4006 defines two sets of slotted openings 4009. A platform 4005 extends between the two sets of slotted openings 4009.

The plug 4002 also includes a wire manager 4008 for managing the twisted wire pairs and a strain relief boot 4010, which snaps to the plug nose body 4004 (see FIG. 22).

The connector arrangement 4000 also includes a storage device 4030 (FIG. 22) that is configured to store information (e.g., an identifier and/or attribute information) pertaining to the segment of physical communications media (e.g., the plug 4002 and/or the electrical cable terminated thereat). In some implementations, the connector arrangement 4000 also can include additional components to aid in physical layer management.

In one implementation, the connector arrangement 4000 also can include a communications device (not shown) that is configured to send and receive communications signals to and from a local source. For example, the communications device can include an IR transceiver. Such a communications device can enable a technician to read and/or write data to the storage device 4030 using an infra-red wand or probe (e.g., a hand-held wand or probe). Accordingly, the technician can access information stored on the connector arrangement 4000 without unplugging the connector arrangement 4000 from a port of connector assembly 4100.

In some implementations, the storage device 4030 can be arranged on a circuit 4020 (FIG. 22) that is mounted to the modular plug 4002 (see FIG. 22). In the example shown, the circuit 4020 is positioned between plug nose body 4004 and plug cover 4006. In certain implementations, additional components, such as a MOSFET or a communications device, can be arranged on the circuit 4020.

In the example shown in FIG. 22, the circuit 4020 includes a substrate with conductive traces electrically connecting contacts and lands. The circuit 4020 also includes circuit components, including the media storage device 4030, at the lands. In the example shown in FIG. 22, the circuit 4020 includes a MOSFET 4032, an EEPROM 4034. In one implementation, the EEPROM 4034 forms the media storage device 4030 for modular plug 4002. In other implementations, however, the storage device 4030 can include any suitable type of memory.

In accordance with some aspects, the circuit 4020 is an FR-4 PCB 4022 defining a U-shaped body having a base 4024 and legs 4026. The MOSFET 4032 and the EEPROM 4034 can be mounted to the base 4024 of the PCB 4022. The circuit contacts are arranged on the legs 4026 of the PCB 4022. The circuit contacts permit connection of the EEPROM 4034 to a media reading interface 4188 of the connector assembly 4100 as will be disclosed herein. In one example, contacts of the media reading interface 4188 can extend through the slotted openings 4009 to connect to the circuit contacts.

Referring now to FIGS. 23-38, an example connector assembly 4100 is shown. In the example shown, the connector assembly 4100 forms a patch panel 4102 for rack or frame mounting and defines a plurality of ports 4104 (see FIG. 31). In one example, connector assembly 4100 includes one or more modular RJ 45 jack modules 4106, which snap-fit to connector assembly 4100 to define the ports 4104 (see FIG. 38). The RJ jack modules 4106 connect to twisted pair cables, or other signal transmission structures, such as PCBs. Plugs 4002 are inserted into jack modules 4106 to enable main signal transmission from the cable through jack module 4106 to another cable or other signal transmission media.

The connector assembly 4100 also includes a media reading interface 4188 (FIG. 25) that permits reading (e.g., by a processor) of the information stored in the storage device 4030 of the connector arrangement 4000. The information read from the storage device 4030 can be transferred to a physical layer management network (e.g., network 101 of FIG. 1, network 218 of FIG. 2, etc.) as will be disclosed herein. In some examples implementations, the circuitry associated with storage device 4030 and the circuitry associated with media reading interface 4188 does not affect the main signal transmission interface between the plug and the jack.

Figure 23:
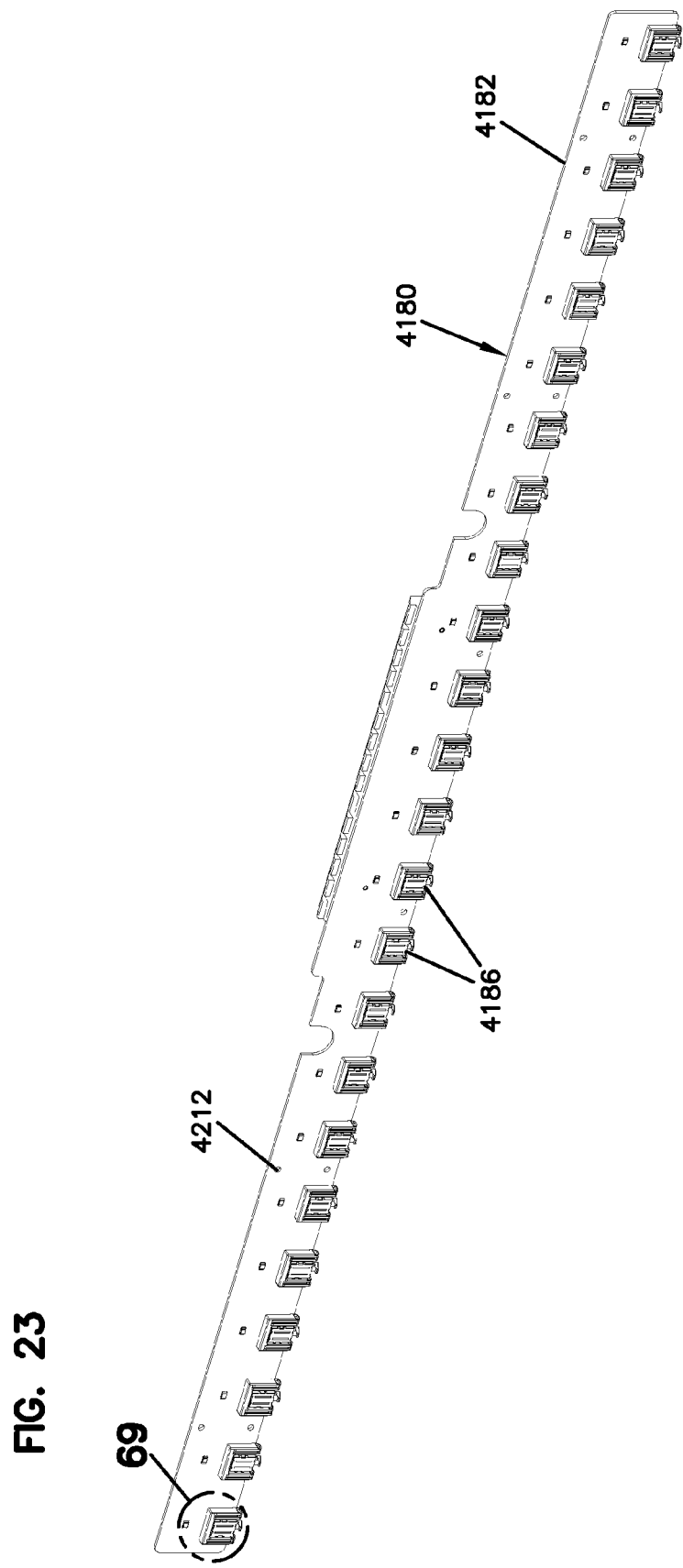
FIGS. 23-38 show an example connector assembly and components thereof in accordance with the principles of the present disclosure.
Figure 24:
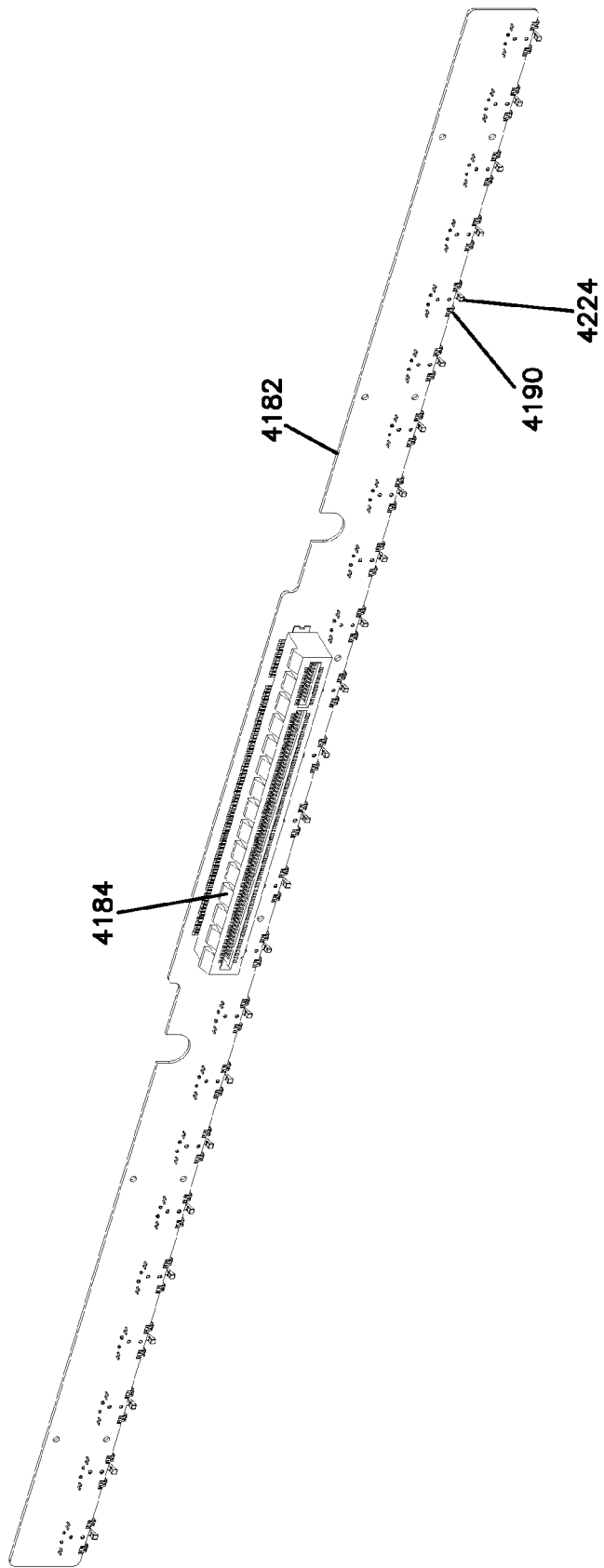
Figure 30:
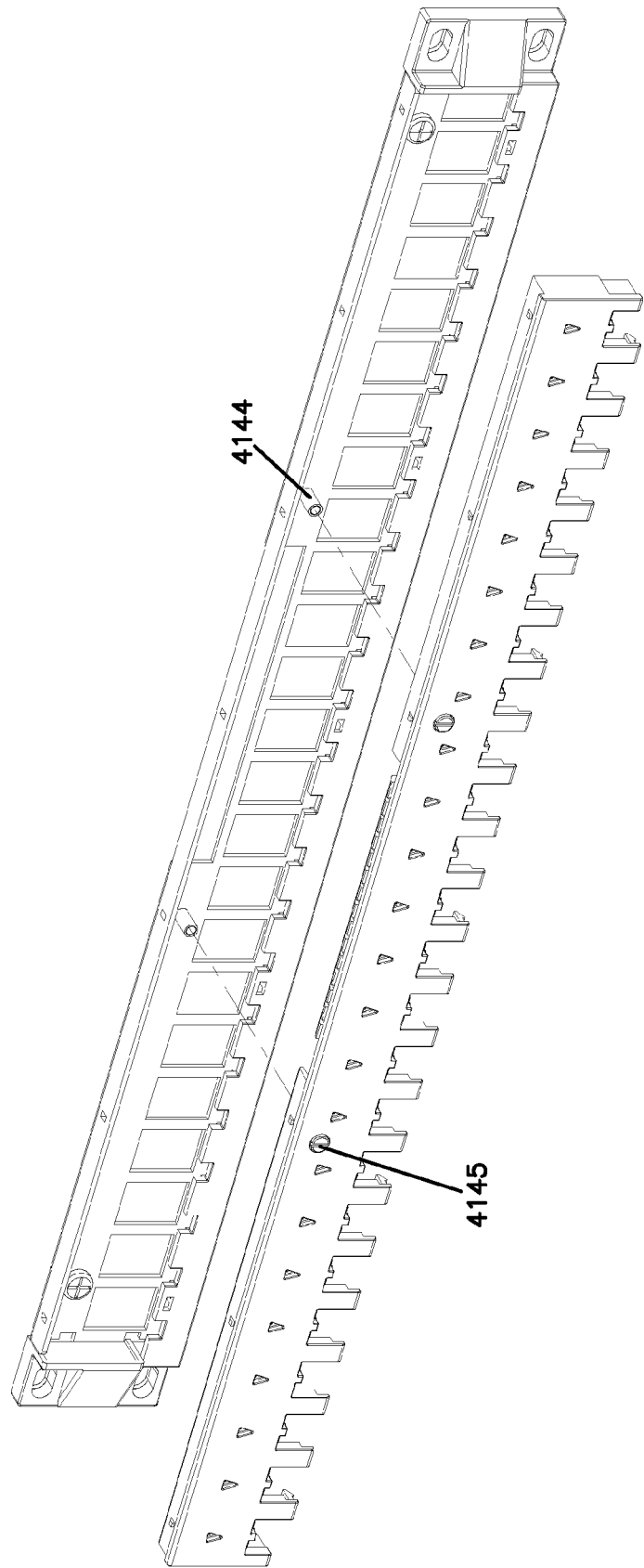
Figure 31:
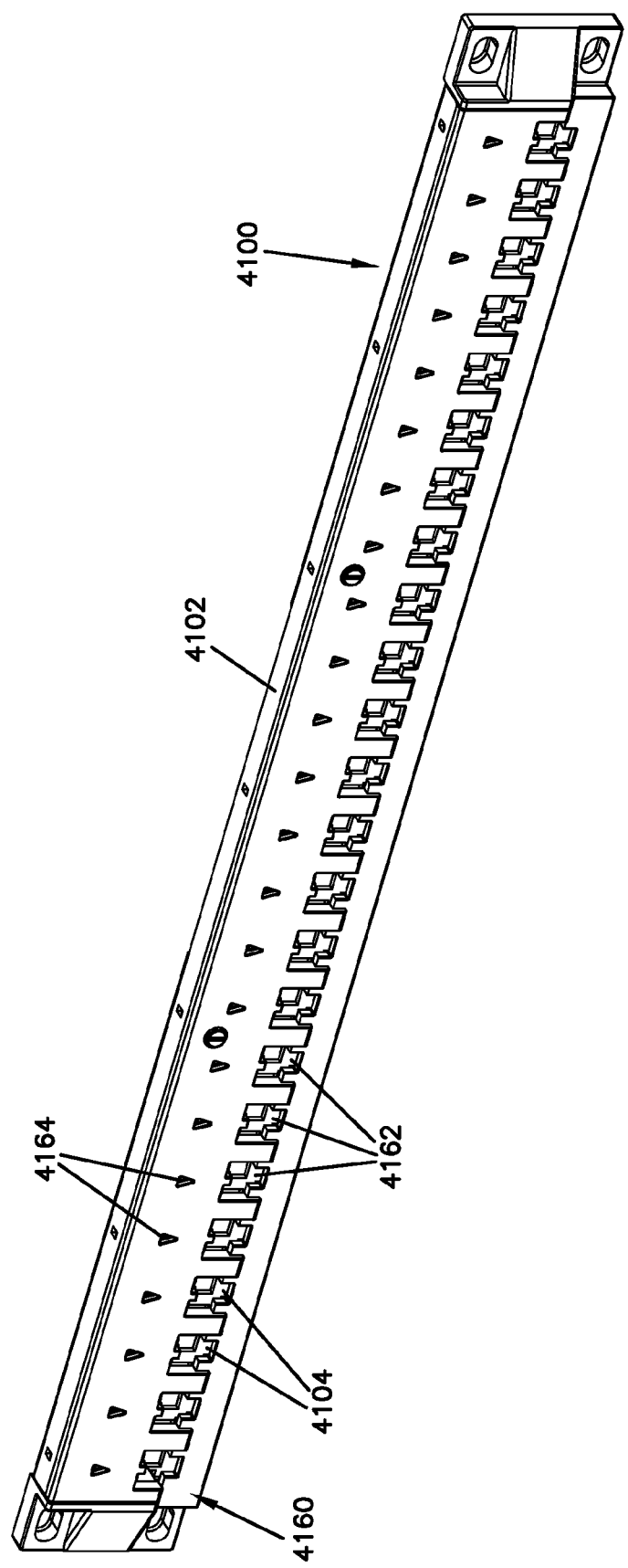
Figure 32:
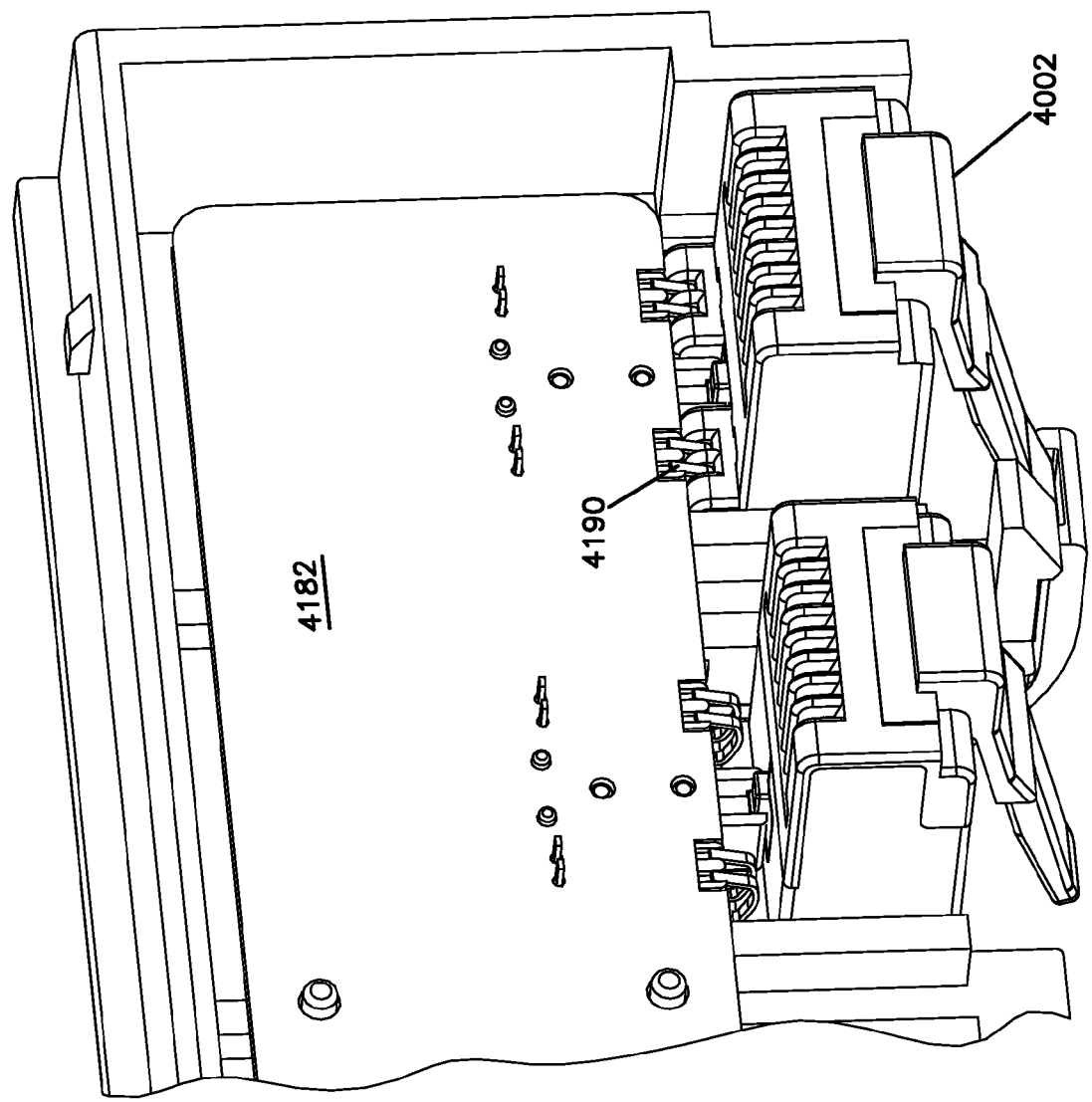
Figure 33:
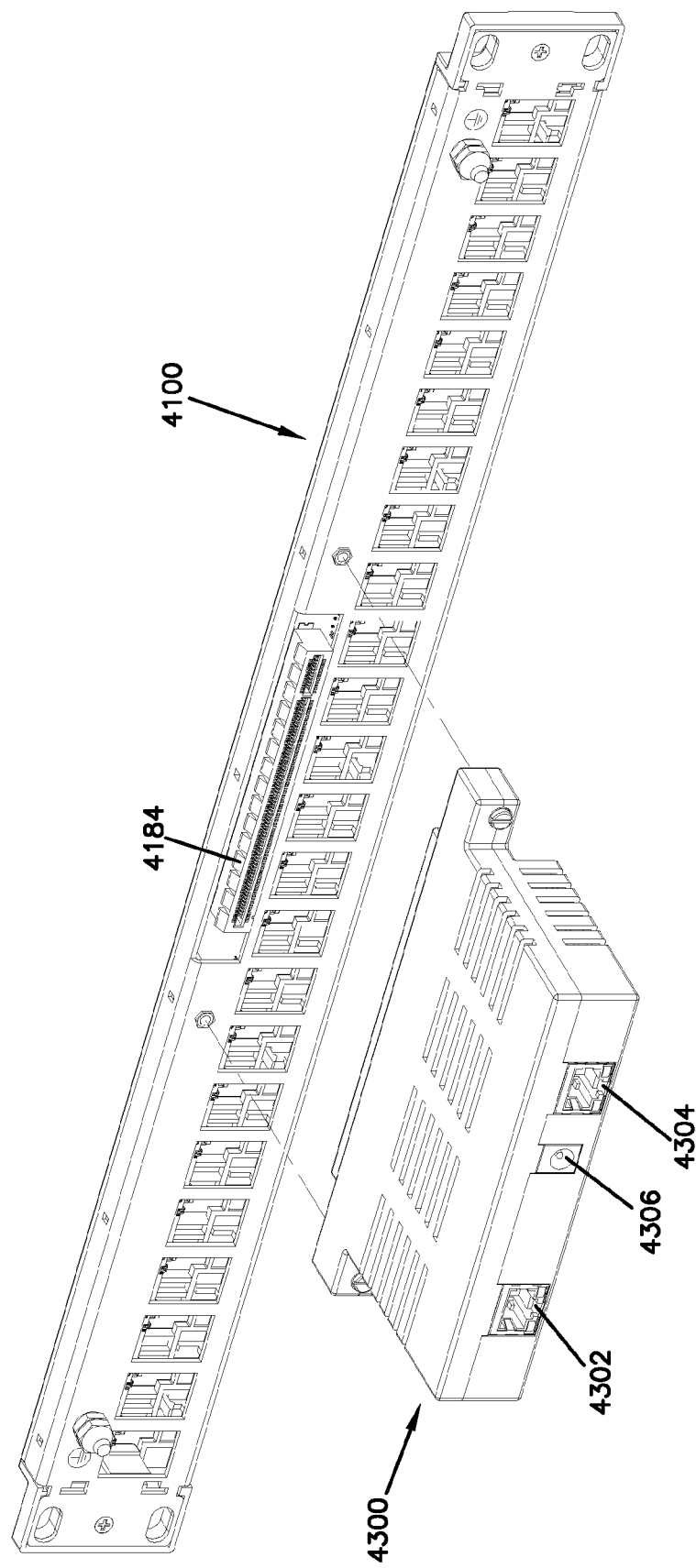

In the example shown, the patch panel 4102 includes internal circuitry 4180 (FIGS. 23-24) enclosed between a frame 4120 (FIGS. 28-30) and a fascia 4160 (see FIG. 31). Circuitry 4180 includes a main PCB 4182 (FIG. 23). The main PCB 4182. The main PCB 4182 includes a main communications interface connector 4184 and storage interface connectors 4186 (see FIGS. 11-12). In one example, the communications interface connector 4184 is mounted to an upper end of the main PCB 4182 and the storage interface connectors 4186 are mounted to a lower end of the PCB 4182.

Storage interface connectors 4186 form the media reading interface 4188 for connector assembly 4100. In the example shown in FIG. 25, the storage interface connectors 4186 include a set of contacts 4190 that extend over a bottom edge of the PCB 4182. A modular plug 4002 can be arranged within the connector assembly 4100 so that the circuit contacts on the plug PCB 4022 contact the contacts 4190 on the PCB 4182. In the example shown, the contacts 4190 are split into two spaced groups.

In certain implementations, a microswitch 4224 can be mounted to the PCB 4182 adjacent to each storage interface connector 4182 for sensing the presence of a connector arrangement 4000 inserted into the corresponding jack 4106. In the example shown, the microswitch 4224 extends downwardly from the PCB 4182 between the two groups of contacts 4190 (see FIG. 25). In accordance with one example, when a plug 4002 is arranged within the connector assembly 4100, the microswitch 4224 is depressed by the base 4005 of the plug 4002.

Figure 25:
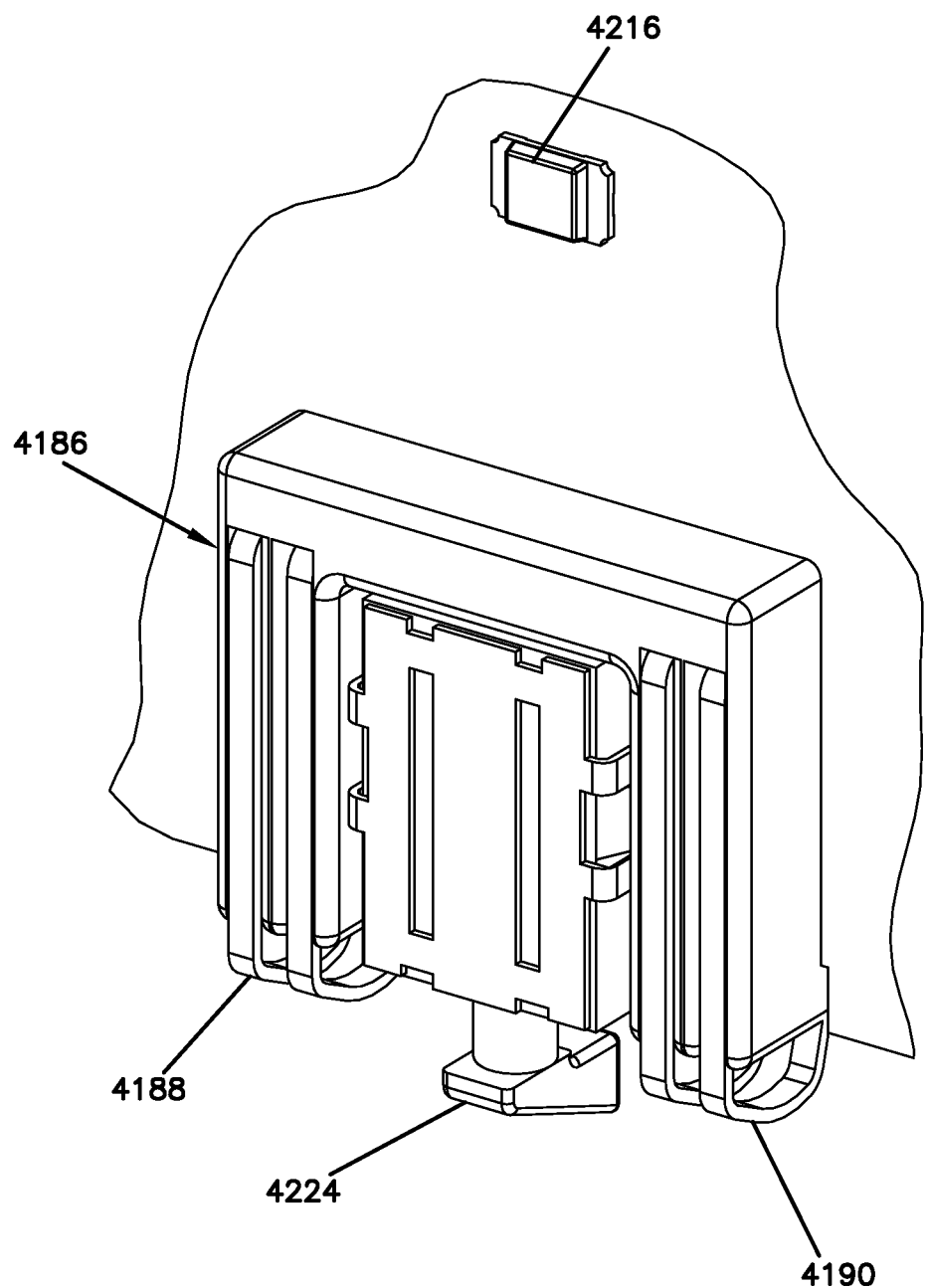

In certain implementations, the PCB 4182 also includes an LED indicator 4216 adjacent each storage interface connector 4186 of the PCB 4182 (see FIG. 25). In the example shown, each LED indicator 4216 is a bi-color indicator. The indicator 4216 can be used to indicate a particular jack module 4106 to a technician. For example, the indicator 4216 can be lit to indicate into which jack module 4106 a technician should insert a plug 4002. The indicator 4216 also can indicate which jack module 4106 contains a particular plug 4002.

The frame 4120 includes a main portion 4122 and ends 4124, 4126. Each end 4124, 4126 of the frame 4120 defines holes 4128 to mount frame 4120 to a rack. The main portion 4122 of the frame 4120 includes upper and lower flanges 4140. The main portion 4122 defines one or more openings 4132 configured to receive the jack modules 4106. Frame 4120 also defines a second aperture 4134 (FIG. 28) configured to receive the communications interface connector 4184 (e.g., see FIG. 33).

The fascia 4160 is coupled to the frame 4120 to secure the PCB 4182 therebetween. The fascia 4160 defines opening 4162 (FIG. 31) that align with openings 4110 of the jack modules 4106 when the jack modules 4106 are mounted to the frame 4120. The PCB 4182 is arranged above the openings 4162. Plugs 4002 of the connector arrangement 4000 can be inserted through the openings 4162 and into the jack modules 4106. The fascia 4160 also defines openings 4164 for the passage of light signals from the LED indicators 4216 of the internal circuitry 4180 (see FIG. 31).

Figure 26:
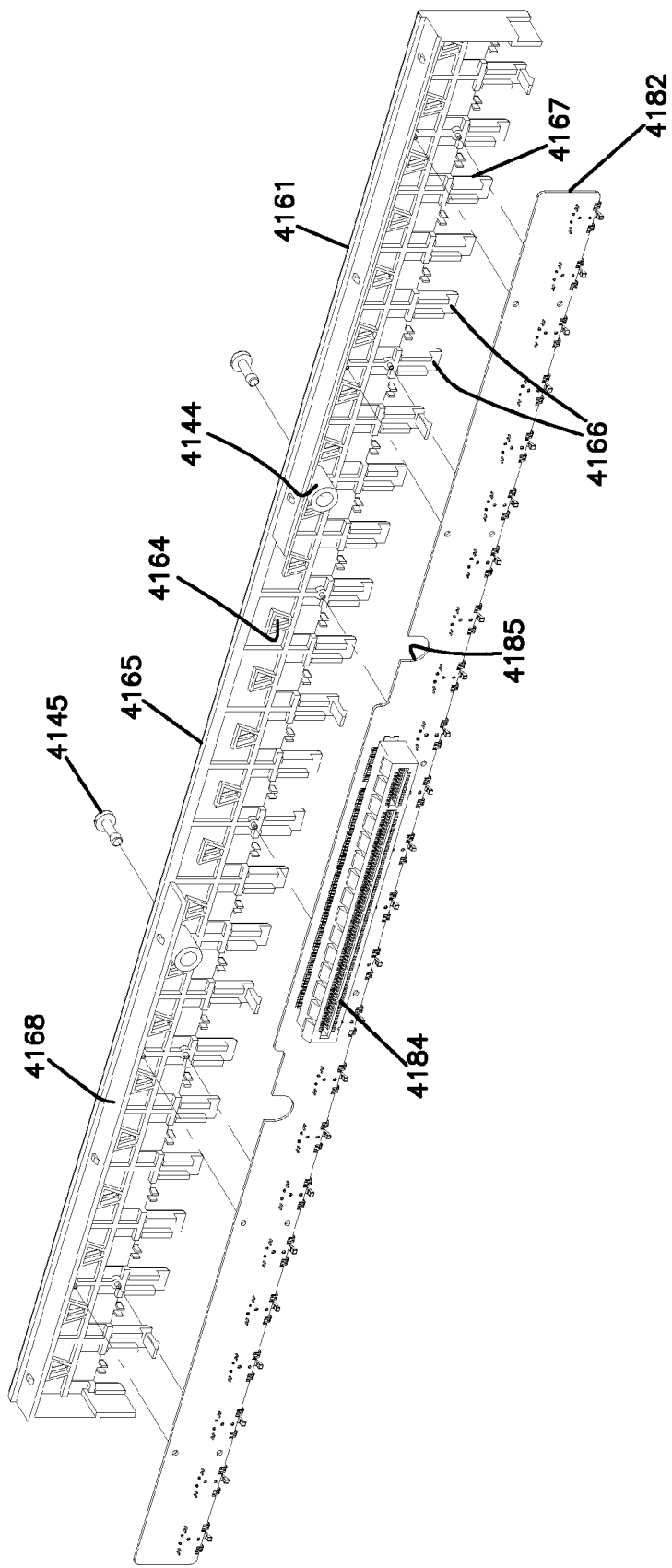
Figure 27:
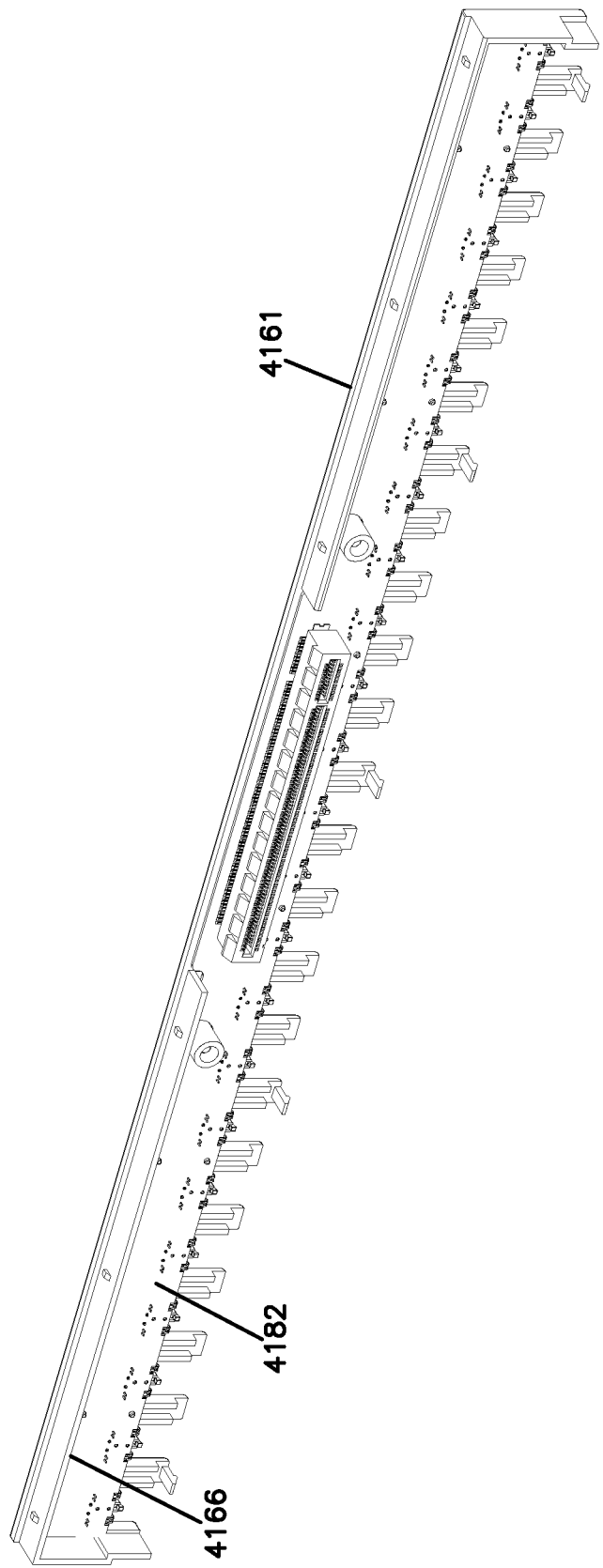
Figure 28:
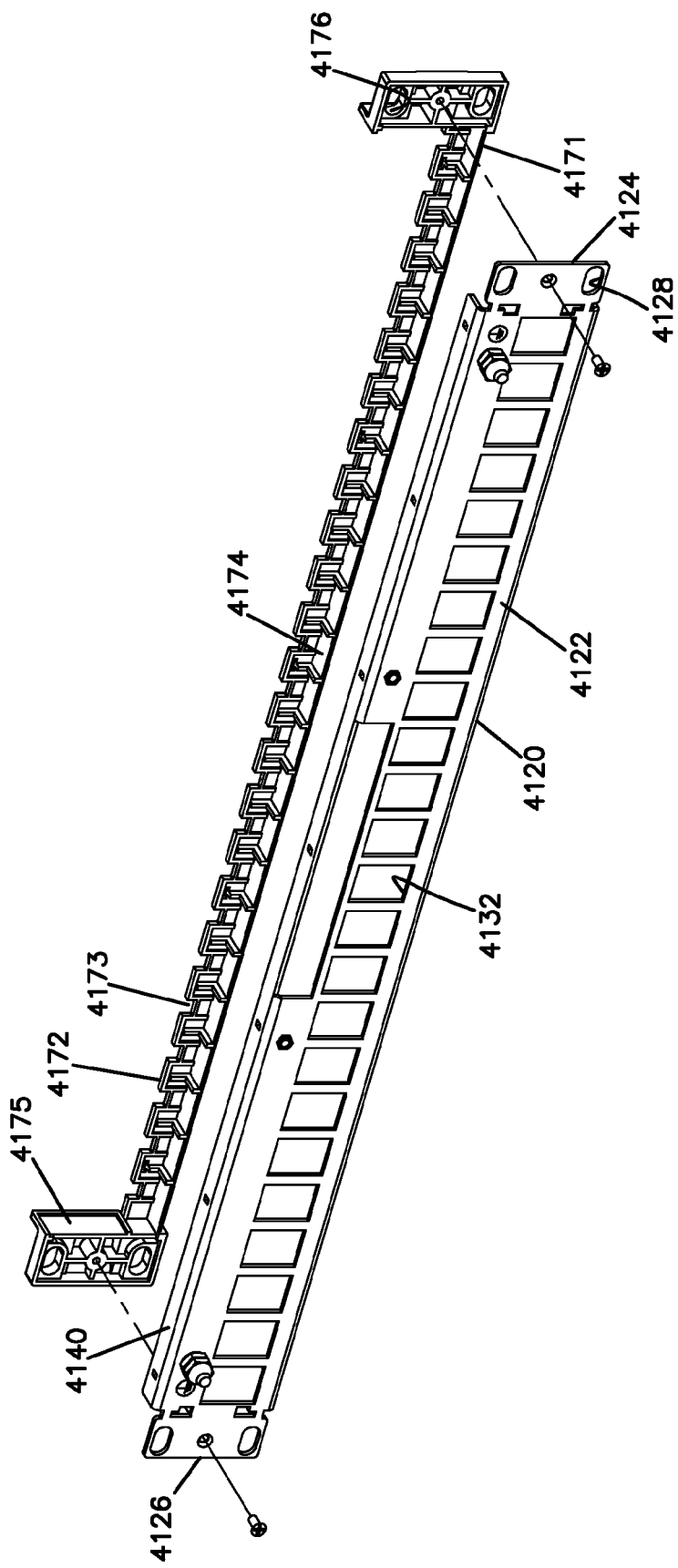

In certain implementations, the fascia 4160 can be formed in multiple pieces. In the example shown, the fascia 4160 includes an upper piece 4161 and a lower portion 4171. The upper and lower pieces 4161, 4171 cooperate to define openings 4162. In the example shown, the upper piece 4161 includes legs 4166 extending downwardly from a main portion 4165 to define slots 4167 (FIG. 26). The lower piece 4171 includes flanges 4172 that extend upwardly from a transverse portion 4174 to define slots 4173 (FIG. 28). The legs 4166 and flanges 4172 cooperate to merge slots 4167 and 4173 into openings 4162 (e.g., see FIG. 31).

The upper piece 4161 of the fascia 4160 also includes flanges 4168, which protrude inwardly from either end of the main portion 4165. The flanges 4168 are separated sufficiently to accommodate the communications interface connector 4184 (see FIG. 27).

In the example shown, the connector assembly 4100 is assembled by mounting the PCB 4182 to the upper piece 4161 of the fascia 4160 to form a first unit. Locator holes 4212 (FIG. 26) defined by the PCB 4182 align with posts 4166 (FIG. 27) of upper piece 4161 of the fascia 4160 to facilitate assembly of the PCB 4182 to fascia 4160 (see FIGS. 26-27).

The PCB 4182 also defines cutouts 4185 that accommodate standoffs 4144 protruding inwardly from the upper piece 4161 of the fascia 4160.

Figure 29:
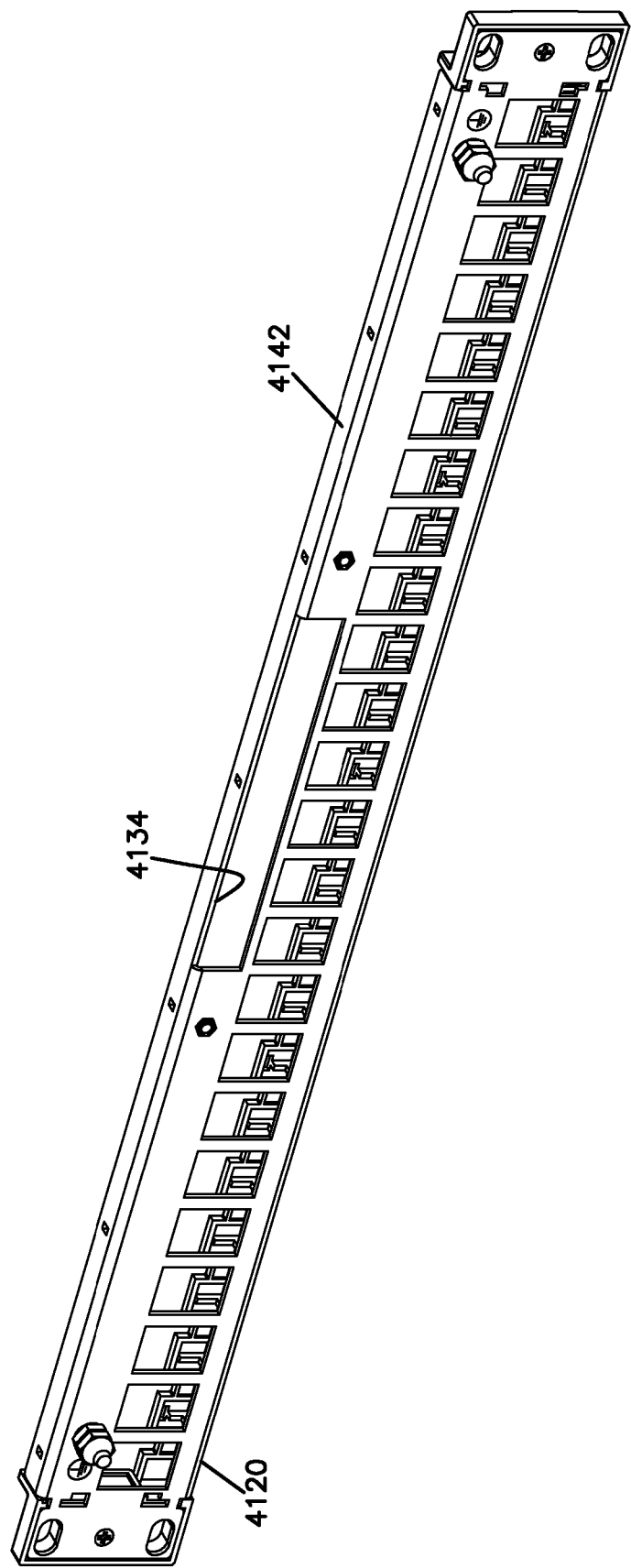

The lower piece 4171 of the fascia 4160 mounts to the frame 4120 to form a second unit (see FIGS. 28-29). The lower piece 4171 includes ends 4175 that define openings 4176 that align with openings 4128 on frame ends 4124 and 4126. In some implementations, one or more fasteners can secure the ends 4175 of the lower piece 4171 to the ends 4124, 4126 of the frame 4120. In other implementations, fasteners can be inserted through the main body of the frame 4120 and/or fascia 4160.

The first unit is removably coupled to the second unit (see FIGS. 30-31). Tabs 4142 on the flanges 4140 cooperate with a complementary mating structure on the flanges 4168 of the fascia 4160 to connect the fascia 4160 to the frame 4120 (see FIG. 31). Standoffs 4144 accept screws 4145 or other fasteners for mounting the front panel 4160 to the frame 4120.

Because the first unit includes only the upper fascia 4161, the first unit can be removed from the second unit without disturbing the jack modules 4106 and modular plugs 4002 mounted to the second unit. Accordingly, the PCB 4182 can be replaced by replacing the upper piece 4161 of the fascia 4160 without unplugging the plug modules 4002 from the jack modules 4106.

Figure 34:
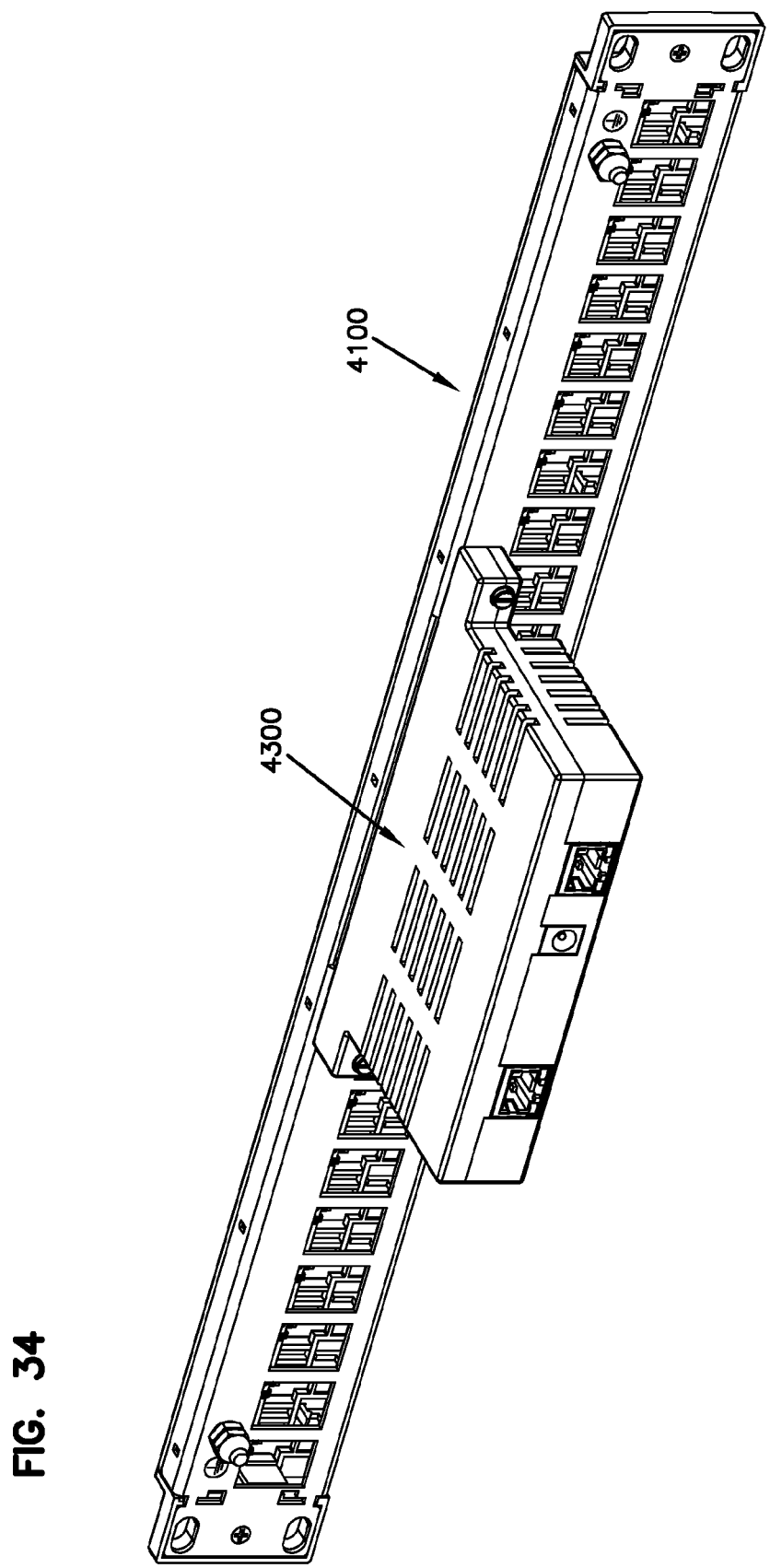
Figure 35:
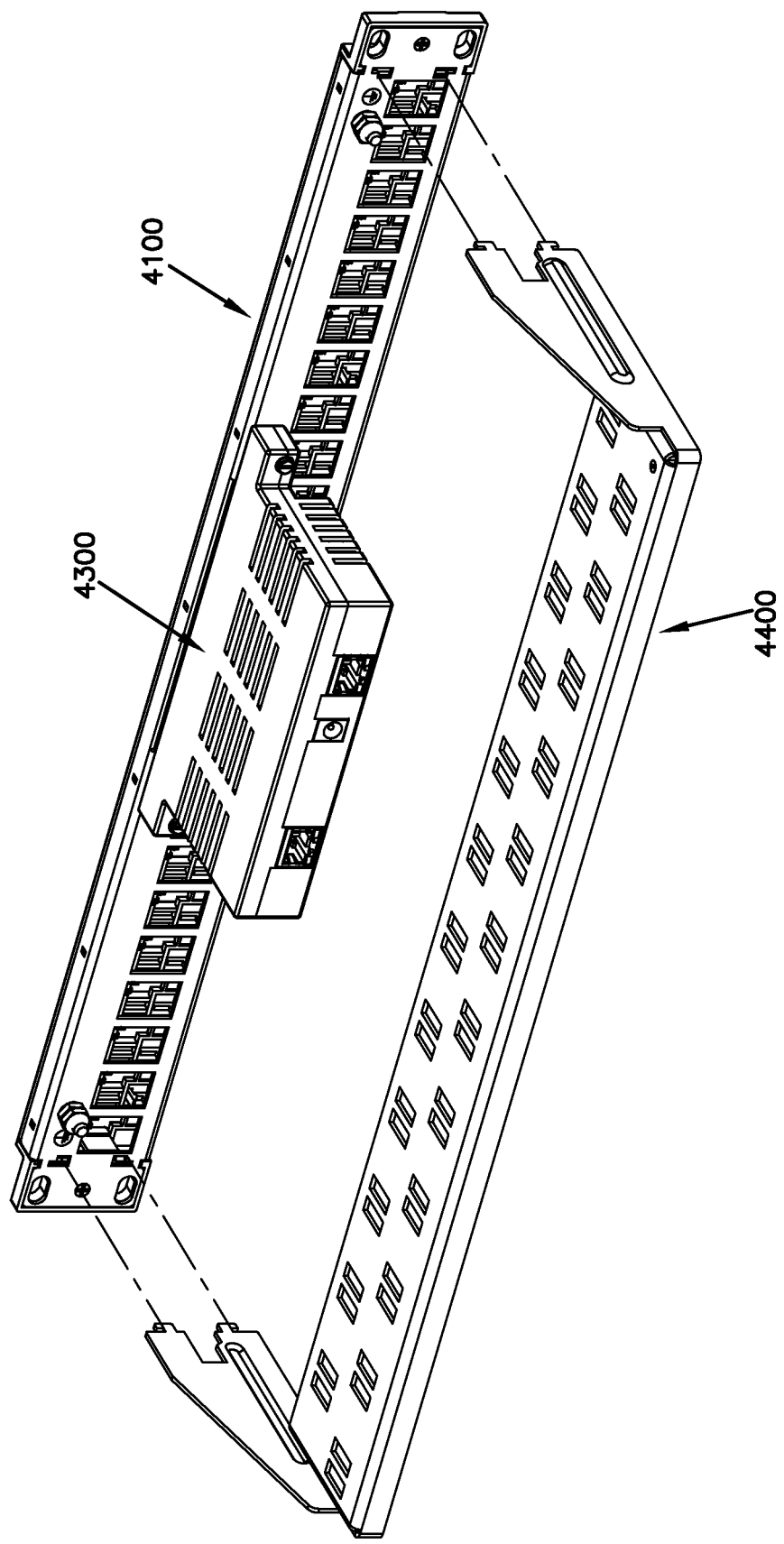
Figure 36:
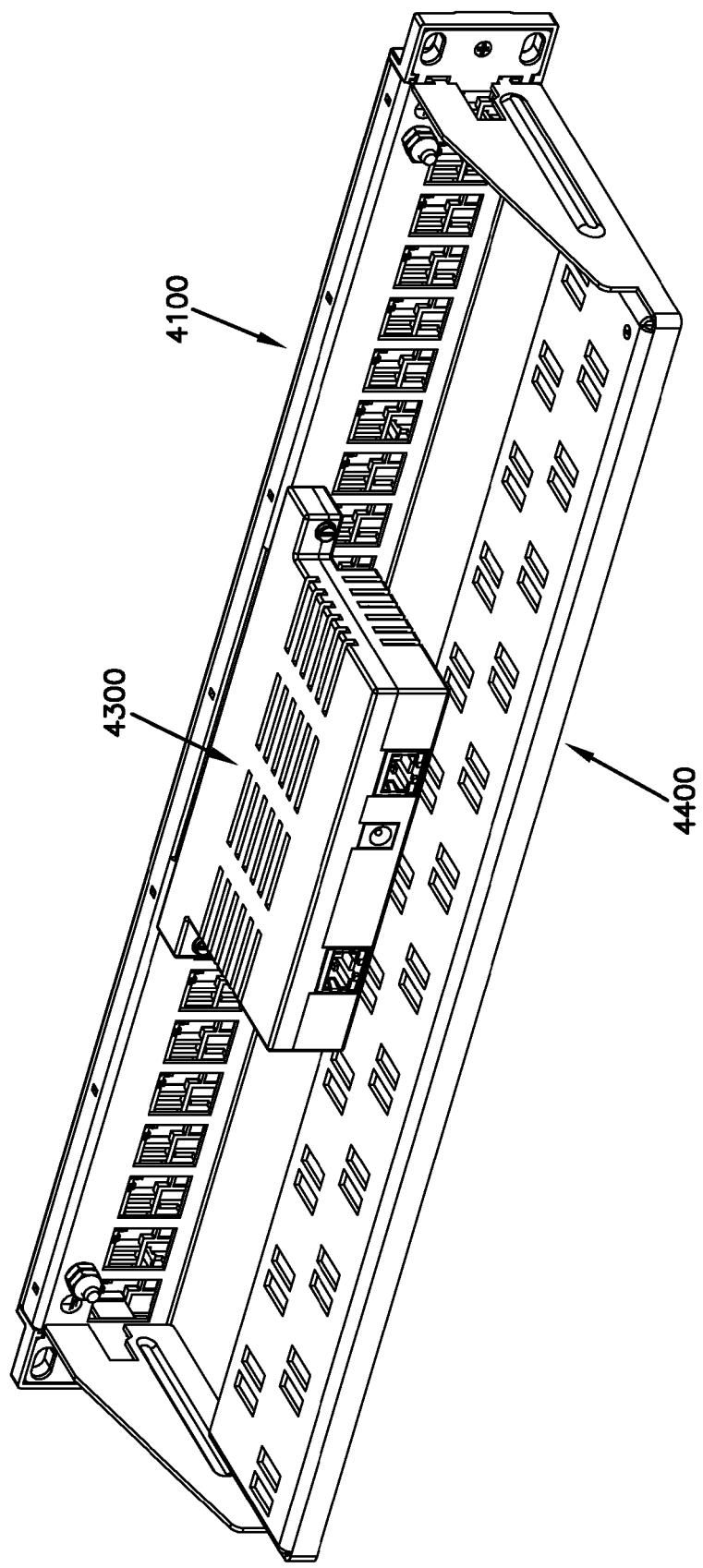
Figure 37:
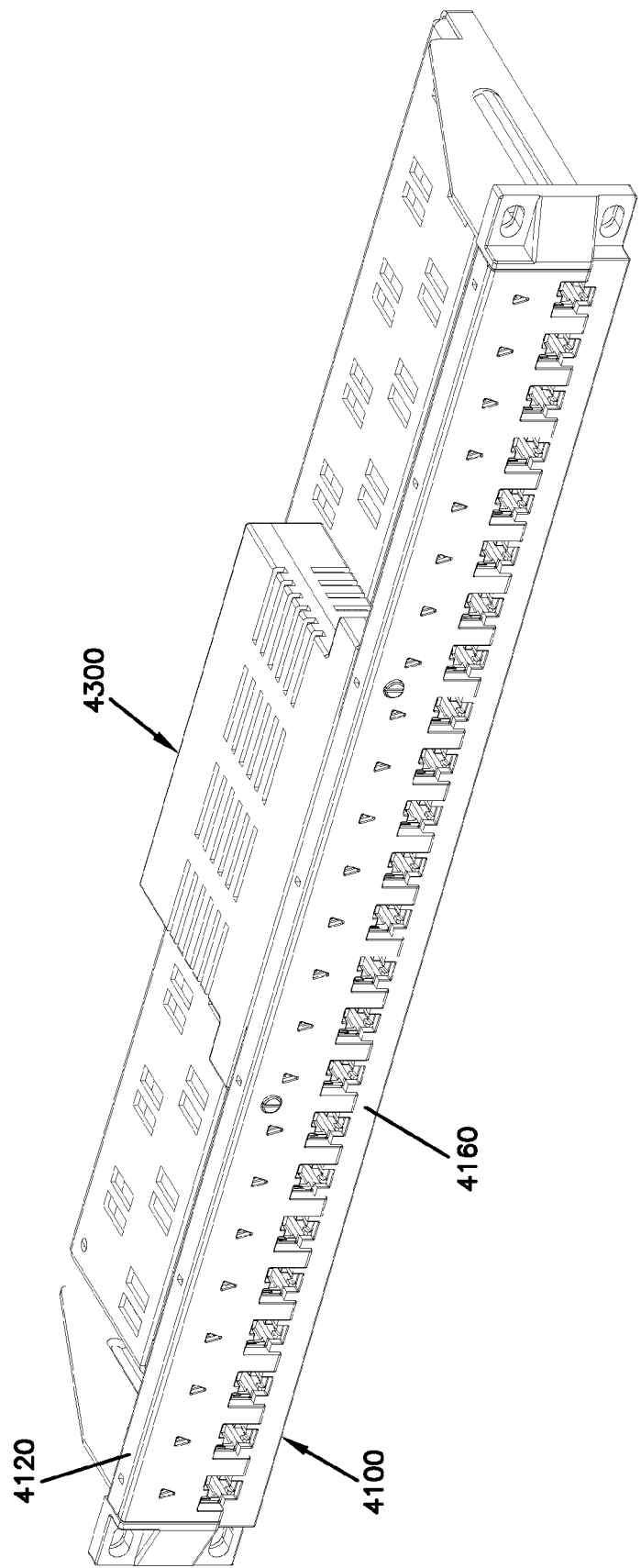
Figure 38:
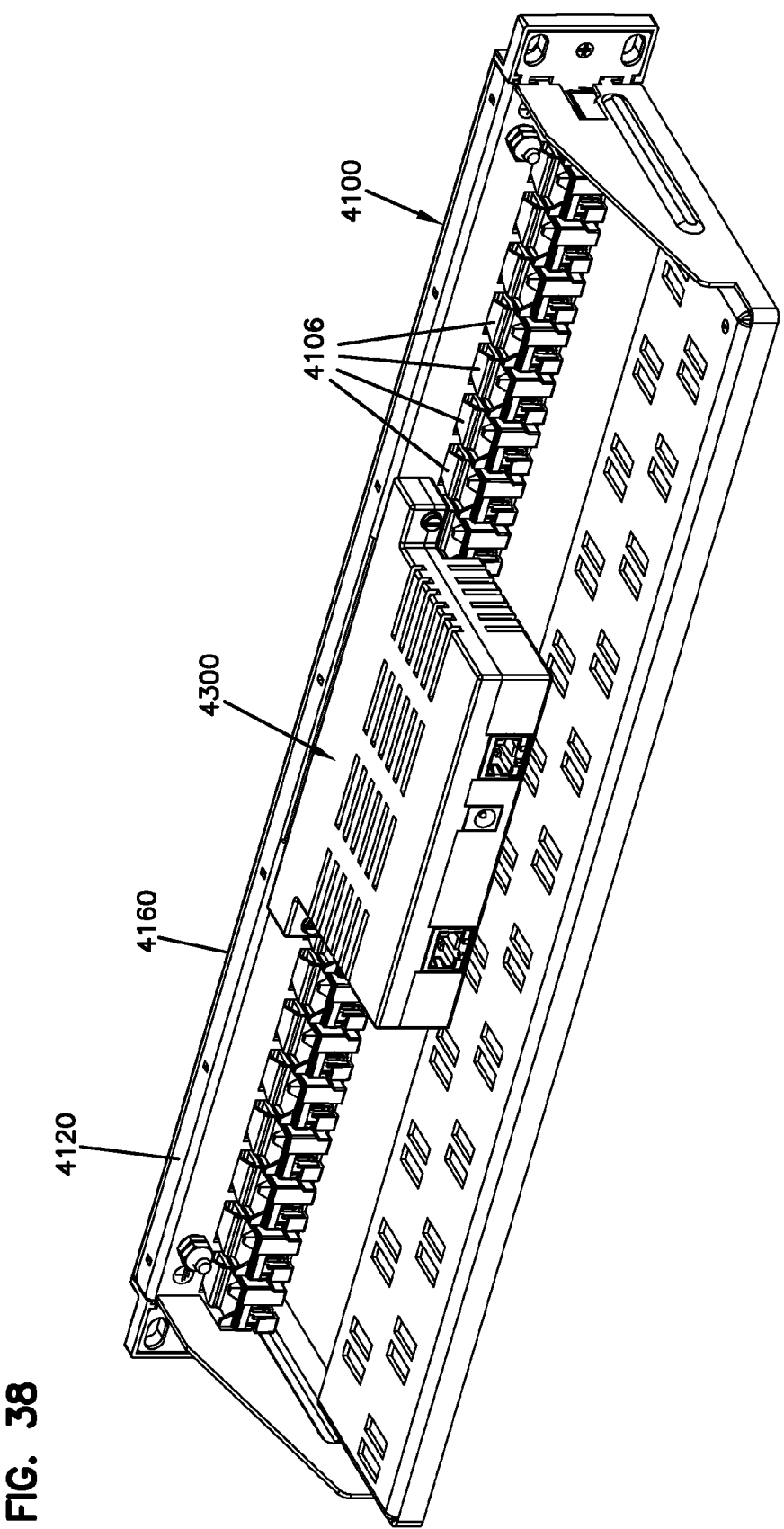

Once connected, information can be read from media storage device 4030 of the connector arrangement 4000 by a CPU card 4300 connected to main communications interface connector 4184 (see FIG. 34). The CPU card 4300 includes circuitry and components including a processor that is configured to read information obtained from the storage device 4030 of the connector arrangement 4000. Communications ports 4302, 4304 of the CPU card 4300 can be connected to the physical layer management network. A power port 4306 also can be defined by the CPU card 4300.

A number of implementations of the invention defined by the following claims have been described. Nevertheless, it will be understood that various modifications to the described implementations may be made without departing from the spirit and scope of the claimed invention. Accordingly, other implementations are within the scope of the following claims.

The invention claimed is:

1. A connector assembly comprising:
   a housing including a frame and a fascia, the frame defining a plurality of openings, the fascia being coupled to the frame and defining a plurality of openings that align with the openings of the frame to define passages, each opening of the fascia defining a keyway at a first side of the housing;
   a printed circuit board mounted to the housing;
   at least a first jack module mounted at least partially within a first of the passages defined in the housing, the first jack module including a body defining a port that is configured to receive a connector arrangement along an insertion axis that extends generally perpendicular to the printed circuit board, the first jack module including a first contact arrangement that is isolated from the printed circuit board; and
   at least a first media reading interface connected to the housing at the first passage, the media reading interface being electrically coupled to the printed circuit board, at least a portion of the media reading interface extending through the body and into the port of the first jack module from the first side of the housing.

2. The connector assembly of claim 1, wherein the printed circuit board mounts between the frame and the fascia.

3. The connector assembly of claim 1, wherein the jack module includes an RJ-45 jack.

4. The connector assembly of claim 1, wherein the fascia includes a first piece and a second piece that cooperate to define the openings of the fascia, the first piece being removably coupled to the second piece.

5. The connector assembly of claim 1, wherein the printed circuit board defines openings that align with the openings of the frame and the openings of the fascia.

6. The connector assembly of claim 1, further comprising a cable manager extending rearwardly from the housing.

7. The connector assembly of claim 1, further comprising an LED indicator associated with each port.

8. The connector assembly of claim 1, further comprising at least a first presence sensor arranged on the printed circuit board, the first presence sensor being associated with the port of the first jack module, and the first presence sensor being configured to determine when the connector arrangement has been inserted into the port of the first jack module.

9. The connector assembly of claim 8, wherein the first presence sensor includes a tactile pressure sensor.

10. The connector assembly of claim 1, wherein the printed circuit board includes a communications interface connector that is configured to receive a CPU connector, which includes a processor that is configured to read information from a storage device of a connector arrangement received in the port of the first jack module.

11. The connector assembly of claim 10, wherein the communications interface connector is disposed at an upper end of the printed circuit board at a center of the printed circuit board.

12. The connector assembly of claim 1, further comprising the CPU connector including the processor, the CPU connector defining a power port and a data port.

13. The connector assembly of claim 12, wherein the data port is configured to receive an RJ45 connector.

14. The connector assembly of claim 12, wherein the power port is configured to receive Power over Ethernet.

15. The connector assembly of claim 12, wherein the CPU connector extends rearwardly from the housing.

16. A connector assembly comprising:
   a housing supporting a plurality of jack modules, each jack module having a first set of electrical contacts, each jack module defining a port that is configured to receive a connector arrangement along an insertion axis so that plug contacts on the connector arrangement engage the first set of electrical contacts;
   a plurality of second sets of electrical contacts, the second sets of electrical contacts being electrically isolated from the first sets of electrical contacts, each second set of electrical contacts being associated with one of the jack modules and partially extending into the respective jack module;
   a circuit board coupled to the housing so that major surfaces of the circuit board extend perpendicular to the insertion axis, the circuit board being isolated from the first set of electrical contacts, the circuit board being configured to be physically and electrically contacted by the second set of electrical contacts; and
   a processor module mounted to the circuit board, the processor module including a housing holding a processor, the housing defines a power port and a data port, the processor being configured to read physical layer information from a storage device on a connector arrangement received at one of the jack modules via the respective second set of electrical contacts.

17. The connector assembly of claim 16, wherein the processor module extends rearwardly from the housing.

18. The connector assembly of claim 16, further comprising indicators at each port.

19. The connector assembly of claim 18, wherein the indicators include light emitting diodes.

20. The connector assembly of claim 18, wherein the indicators include bi-color indicators.

* * * * *